US 12,527,033 B2

United States Patent
Park et al.

(10) Patent No.: US 12,527,033 B2
(45) Date of Patent: Jan. 13, 2026

(54) DISPLAY DEVICE AND METHOD OF MANUFACTURING THE SAME

(71) Applicants: Samsung Display Co., LTD., Yongin-si (KR); Industry-University Cooperation Foundation Hanyang University ERICA Campus, Ansan-si (KR)

(72) Inventors: Joon Seok Park, Yongin-si (KR); Saeroonter Oh, Seoul (KR); Ki Hwan Kim, Anyang-si (KR); Myounghwa Kim, Seoul (KR); Min Goo Kim, Seoul (KR); Jun Hyung Lim, Seoul (KR)

(73) Assignees: Samsung Display Co., Ltd., Yongin-si (KR); Industry-University Cooperation Foundation Hanyang University ERICA Campus, Ansan-si (KR)

( * ) Notice: Subject to any disclaimer, the term of this patent is extended or adjusted under 35 U.S.C. 154(b) by 569 days.

(21) Appl. No.: 17/938,658

(22) Filed: Oct. 6, 2022

(65) Prior Publication Data
US 2023/0263017 A1 Aug. 17, 2023

(30) Foreign Application Priority Data
Jan. 26, 2022 (KR) .................. 10-2022-0011646

(51) Int. Cl.
*H01L 27/32* (2006.01)
*H01L 51/56* (2006.01)
(Continued)

(52) U.S. Cl.
CPC ..... *H10D 30/6757* (2025.01); *H10D 86/0231* (2025.01); *H10D 86/423* (2025.01);
(Continued)

(58) Field of Classification Search
CPC ................................................. H10D 30/6757
See application file for complete search history.

(56) References Cited

U.S. PATENT DOCUMENTS 8,766,255 B2  7/2014  Isobe et al.
9,048,130 B2  6/2015  Yamazaki et al.
(Continued)

FOREIGN PATENT DOCUMENTS

CN  103227201 A  *  7/2013  .......... H01L 21/6835
CN  101740630 B  *  3/2014  ....... H01L 21/02554
(Continued)

OTHER PUBLICATIONS

Machine translation, Yamazaki, Chinese Pat. Pub. No. CN-101740630-B, translation date: Jul. 10, 2025, Clarivate Analytics, all pages. (Year: 2025).*

(Continued)

*Primary Examiner* — Victoria K. Hall
(74) *Attorney, Agent, or Firm* — Womble Bond Dickinson (US) LLP

(57) ABSTRACT

A display device includes: a substrate; a barrier layer on the substrate, and including: a trench area recessed in a direction towards the substrate; and a flat area surrounding the trench area, and having a flat upper surface; and a switching transistor and a driving transistor on the barrier layer. The switching transistor includes: a first active layer on the barrier layer, at least a portion of the first active layer being located at the trench area, the first active layer including a channel area, and a source area and a drain area at opposite sides of the channel area; a first gate electrode on the first active layer; and a first upper electrode and a second upper electrode on and connected to the first active layer.

13 Claims, 45 Drawing Sheets

(51) Int. Cl.
 *H10D 30/67* (2025.01)
 *H10D 86/01* (2025.01)
 *H10D 86/40* (2025.01)
 *H10D 86/60* (2025.01)
 *H10K 59/121* (2023.01)
 *H10K 59/123* (2023.01)
 *H10K 59/12* (2023.01)
 *H10K 59/124* (2023.01)
 *H10K 71/00* (2023.01)

(52) U.S. Cl.
 CPC ......... *H10D 86/60* (2025.01); *H10K 59/1213* (2023.02); *H10K 59/123* (2023.02); *H10K 59/1201* (2023.02); *H10K 59/124* (2023.02); *H10K 71/00* (2023.02)

(56) References Cited

U.S. PATENT DOCUMENTS

| | | | | |
|---|---|---|---|---|
| 2012/0154728 | A1* | 6/2012 | Oh | H10D 86/441 |
| | | | | 438/30 |
| 2012/0223306 | A1* | 9/2012 | Saito | H10D 64/118 |
| | | | | 257/43 |
| 2013/0020575 | A1* | 1/2013 | Ishizuka | H10D 30/6757 |
| | | | | 438/156 |
| 2014/0339549 | A1* | 11/2014 | Yamazaki | H10D 30/6755 |
| | | | | 257/43 |
| 2016/0307980 | A1* | 10/2016 | You | H10D 62/343 |
| 2017/0053951 | A1* | 2/2017 | Sato | H10D 86/60 |
| 2017/0278917 | A1* | 9/2017 | Kim | H10D 86/421 |
| 2020/0006572 | A1* | 1/2020 | Sharma | H10D 99/00 |
| 2020/0006575 | A1* | 1/2020 | Dewey | H10D 84/038 |
| 2020/0321434 | A1* | 10/2020 | Cheng | H10D 62/364 |
| 2020/0343275 | A1* | 10/2020 | Park | H10D 86/021 |
| 2021/0320276 | A1* | 10/2021 | Chang | H10K 59/124 |
| 2023/0086499 | A1* | 3/2023 | Maxey | H10D 30/47 |
| | | | | 257/66 |

FOREIGN PATENT DOCUMENTS

| | | | | | |
|---|---|---|---|---|---|
| CN | 106898653 | A | * | 6/2017 | ......... H10D 30/6757 |
| CN | 106972038 | A | * | 7/2017 | ........... H10N 70/881 |
| JP | 2017-41527 | A | | 2/2017 | |
| KR | 10-2020-0125843 | A | | 11/2020 | |

OTHER PUBLICATIONS

Machine translation, Han, Chinese Pat. Pub. No. CN-106898653-A, translation date: Jul. 10, 2025, Clarivate Analytics, all pages. (Year: 2025).*

Machine translation, Lee, Chinese Pat. Pub. No. CN-103227201-A, translation date: Jul. 10, 2025, Clarivate Analytics, all pages. (Year: 2025).*

Machine translation, Yang, Chinese Pat. Pub. No. CN-106972038-A, translation date: Jul. 10, 2025, Clarivate Analytics, all pages. (Year: 2025).*

Korean Intellectual Property Office, Request for the Submission of an Opinion, Korean Application No. 10-2022-0011646, Jul. 28, 2025, all pages. (Year: 2025).*

Chen, et al., "Self-aligned top-gate InGaZnO thin film transistors using SiO2/Al2O3 stack gate dielectric," Thin Solid Films, vol. 548, 2013, pp. 572-575.

* cited by examiner

DISPLAY DEVICE AND METHOD OF MANUFACTURING THE SAME

CROSS-REFERENCE TO RELATED APPLICATION

This application claims priority to and the benefit of Korean Patent Application No. 10-2022-0011646, filed on Jan. 26, 2022, in the Korean Intellectual Property Office, the entire content of which is incorporated by reference herein.

BACKGROUND

1. Field

Aspects of embodiments of the present disclosure relate generally to a display device for displaying an image, and a method of manufacturing the display device.

2. Description of Related Art

A display device is manufactured and used in various ways. The display device may display an image to provide visual information to a user. Such a display device may include a liquid crystal display device that emits light using a liquid crystal layer, an inorganic light emitting display device that emits light using an inorganic light emitting diode, and an organic light emitting display device that emits light using an organic light emitting diode.

In order to display a high-quality image using such a display device, it may be desirable to arrange a larger number of pixels in a limited display area.

The above information disclosed in this Background section is for enhancement of understanding of the background of the present disclosure, and therefore, it may contain information that does not constitute prior art.

SUMMARY

One or more embodiments of the present disclosure are directed to a display device for displaying an image.

One or more embodiments of the present disclosure are directed to a method of manufacturing the display device.

According to one or more embodiments of the present disclosure, a display device, includes: a substrate; a barrier layer on the substrate, and including: a trench area recessed in a direction towards the substrate; and a flat area surrounding the trench area, and having a flat upper surface; and a switching transistor and a driving transistor on the barrier layer. The switching transistor includes: a first active layer on the barrier layer, at least a portion of the first active layer being located at the trench area, the first active layer including a channel area, and a source area and a drain area at opposite sides of the channel area; a first gate electrode on the first active layer; and a first upper electrode and a second upper electrode on and connected to the first active layer.

In an embodiment, the channel area may be located in the trench area.

In an embodiment, the trench area may include a first sub trench area, a second sub trench area, and a fin area between the first sub trench area and the second sub trench area. The first active layer may cover the fin area, and may fill at least a portion of the first sub trench area and at least a portion of the second sub trench area.

In an embodiment, the channel area may cover the fin area.

In an embodiment, the driving transistor may include: a second active layer on the flat area of the barrier layer; a second gate electrode on the second active layer; and a third upper electrode and a fourth upper electrode on and connected to the second active layer.

In an embodiment, the display device may further include: a lower electrode between the barrier layer and the second active layer, and overlapping with the second active layer, and the lower electrode may be connected to the second active layer through the third upper electrode.

In an embodiment, the display device may further include: a light emitting element on the third upper electrode, and electrically connected to the third upper electrode.

In an embodiment, the display device may further include: an etch stopper between the substrate and the barrier layer.

In an embodiment, the etch stopper may include at least one selected from the group consisting of indium oxide, gallium oxide, zinc oxide, hafnium oxide, titanium oxide, and zirconium oxide.

In an embodiment, the etch stopper may include at least one selected from the group consisting of silicon oxide, silicon nitride, and silicon oxynitride.

In an embodiment, the trench area may expose the substrate.

In an embodiment, the display device may further include: a first insulation layer between the first active layer and the barrier layer; a second insulation layer on the first active layer to overlap with the channel area; a third insulation layer covering the first gate electrode, the source area, and the drain area; and a fourth insulation layer on the third insulation layer to cover the first upper electrode and the second upper electrode. The first gate electrode may overlap with the second insulation layer.

In an embodiment, the third insulation layer may cover a side surface of the first gate electrode and a side surface of the second insulation layer.

According to one or more embodiments of the present disclosure, a method of manufacturing a display device includes: sequentially forming a barrier layer and a lower conductive layer on a substrate; forming a photoresist layer on the lower conductive layer; exposing the photoresist layer using a halftone mask including a blocking area, a half-tone area, and a full-tone area; forming a trench area by etching the lower conductive layer and the barrier layer in an area exposed corresponding to the full-tone area; removing the photoresist layer in an area exposed corresponding to the half-tone area; partially removing the photoresist layer in an area exposed corresponding to the blocking area; forming a lower electrode by etching the lower conductive layer in the area exposed corresponding to the half-tone area and the photoresist layer in the area exposed corresponding to the full-tone area; forming a switching transistor, at least a portion of the switching transistor filling the trench area; and forming a driving transistor on the lower electrode.

In an embodiment, the method may further include: forming an etch stopper on the substrate before the forming of the barrier layer.

In an embodiment, the forming of the driving transistor may include: forming a first active layer on the lower electrode, the first active layer having a flat shape; forming a first gate electrode on the first active layer; and forming a first upper electrode and a second upper electrode on and connected to the first active layer.

In an embodiment, the method may further include: forming a light emitting element on the driving transistor and connected to the driving transistor.

In an embodiment, the first upper electrode may connect the lower electrode and the first active layer to each other, and the light emitting element may be connected to the first upper electrode.

In an embodiment, the forming of the switching transistor may include: forming a second active layer, at least a portion of a channel area of the second active layer being located in the trench area; forming a second gate electrode on the second active layer; and forming a third upper electrode and a fourth upper electrode on and connected to the second active layer.

In an embodiment, the forming of the trench area may include: forming a first sub trench area, a second sub trench area, and a fin area between the first sub trench area and the second sub trench area.

In an embodiment, the forming of the switching transistor may include: forming a second active layer including: a channel area covering the fin area; a source area adjacent to one end of the channel area and located in the first sub trench area; and a drain area adjacent to another end of the channel area and located in the second sub trench area; forming a second gate electrode on the second active layer; and forming a third upper electrode and a fourth upper electrode on and connected to the second active layer.

In an embodiment, the forming of the trench area may include: etching the barrier layer to expose the substrate in the trench area.

In an embodiment, the forming of the trench area may include: concurrently etching the barrier layer and the lower conductive layer in an area exposed corresponding to the full-tone area.

According to one or more embodiments of the present disclosure, because at least a portion of the first active layer may be disposed at (e.g., in or on) the trench area, an area of the switching transistor in a plan view may be decreased, while a length of the first active layer may be maintained or substantially maintained. Accordingly, an area of a pixel may be decreased, and more pixels may be disposed at (e.g., in or on) the same area (e.g., the same sized area).

However, the present disclosure is not limited to the aspects and features described above, and it is to be understood that both the foregoing general description and the following detailed description are provided as examples, and are intended to provide a further explanation of the aspects and features of the present disclosure as defined in the claims and their equivalents.

BRIEF DESCRIPTION OF THE DRAWINGS

The above and other aspects and features of the present disclosure will be more clearly understood from the following detailed description of the illustrative, non-limiting embodiments with reference to the accompanying drawings.

DETAILED DESCRIPTION

Figure 1:
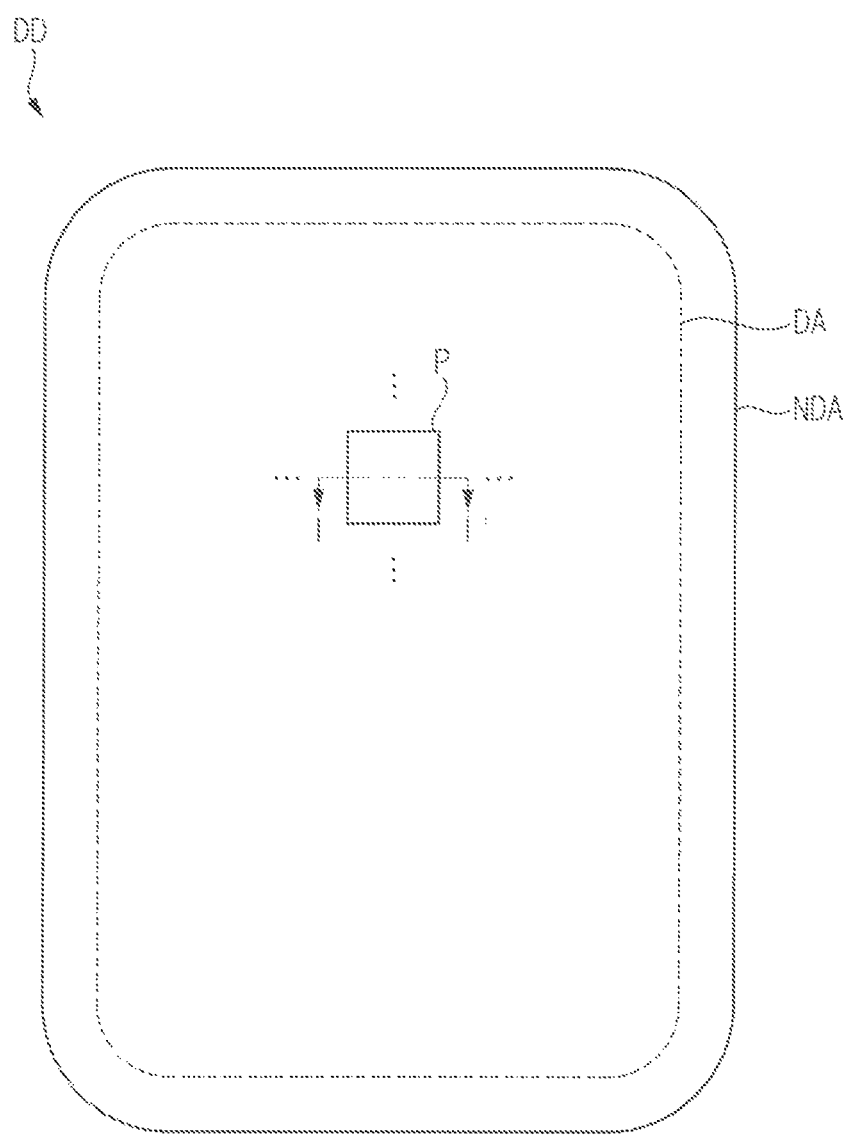
FIG. 1 is a plan view illustrating a display device according to an embodiment.

Hereinafter, embodiments will be described in more detail with reference to the accompanying drawings, in which like reference numbers refer to like elements throughout. The present disclosure, however, may be embodied in various different forms, and should not be construed as being limited to only the illustrated embodiments herein. Rather, these embodiments are provided as examples so that this disclosure will be thorough and complete, and will fully convey the aspects and features of the present disclosure to those skilled in the art. Accordingly, processes, elements, and techniques that are not necessary to those having ordinary skill in the art for a complete understanding of the aspects and features of the present disclosure may not be described. Unless otherwise noted, like reference numerals denote like elements throughout the attached drawings and the written description, and thus, redundant description thereof may not be repeated.

When a certain embodiment may be implemented differently, a specific process order may be different from the described order. For example, two consecutively described processes may be performed at the same or substantially at the same time, or may be performed in an order opposite to the described order.

In the drawings, the relative sizes of elements, layers, and regions may be exaggerated and/or simplified for clarity. Spatially relative terms, such as "beneath," "below," "lower," "under," "above," "upper," and the like, may be used herein for ease of explanation to describe one element or feature's relationship to another element(s) or feature(s) as illustrated in the figures. It will be understood that the spatially relative terms are intended to encompass different orientations of the device in use or in operation, in addition to the orientation depicted in the figures. For example, if the device in the figures is turned over, elements described as "below" or "beneath" or "under" other elements or features would then be oriented "above" the other elements or features. Thus, the example terms "below" and "under" can encompass both an orientation of above and below. The device may be otherwise oriented (e.g., rotated 90 degrees or at other orientations) and the spatially relative descriptors used herein should be interpreted accordingly.

It will be understood that, although the terms "first," "second," "third," etc., may be used herein to describe various elements, components, regions, layers and/or sections, these elements, components, regions, layers and/or sections should not be limited by these terms. These terms are used to distinguish one element, component, region, layer or section from another element, component, region, layer or section. Thus, a first element, component, region, layer or section described below could be termed a second element, component, region, layer or section, without departing from the spirit and scope of the present disclosure.

It will be understood that when an element or layer is referred to as being "on," "connected to," or "coupled to" another element or layer, it can be directly on, connected to, or coupled to the other element or layer, or one or more intervening elements or layers may be present. Similarly, when a layer, an area, or an element is referred to as being "electrically connected" to another layer, area, or element, it may be directly electrically connected to the other layer, area, or element, and/or may be indirectly electrically connected with one or more intervening layers, areas, or elements therebetween. In addition, it will also be understood that when an element or layer is referred to as being "between" two elements or layers, it can be the only element or layer between the two elements or layers, or one or more intervening elements or layers may also be present.

The terminology used herein is for the purpose of describing particular embodiments and is not intended to be limiting of the present disclosure. As used herein, the singular forms "a" and "an" are intended to include the plural forms as well, unless the context clearly indicates otherwise. It will be further understood that the terms "comprises," "comprising," "includes," "including," "has," "have," and "having," when used in this specification, specify the presence of the stated features, integers, steps, operations, elements, and/or components, but do not preclude the presence or addition of one or more other features, integers, steps, operations, elements, components, and/or groups thereof. As used herein, the term "and/or" includes any and all combinations of one or more of the associated listed items. For example, the expression "A and/or B" denotes A, B, or A and B. Expressions such as "at least one of," when preceding a list of elements, modify the entire list of elements and do not modify the individual elements of the list. For example, the expression "at least one of a, b, or c," "at least one of a, b, and c," and "at least one selected from the group consisting of a, b, and c" indicates only a, only b, only c, both a and b, both a and c, both b and c, all of a, b, and c, or variations thereof.

As used herein, the term "substantially," "about," and similar terms are used as terms of approximation and not as terms of degree, and are intended to account for the inherent variations in measured or calculated values that would be recognized by those of ordinary skill in the art. Further, the use of "may" when describing embodiments of the present disclosure refers to "one or more embodiments of the present disclosure." As used herein, the terms "use," "using," and "used" may be considered synonymous with the terms "utilize," "utilizing," and "utilized," respectively. Also, the term "exemplary" is intended to refer to an example or illustration.

Unless otherwise defined, all terms (including technical and scientific terms) used herein have the same meaning as commonly understood by one of ordinary skill in the art to which the present disclosure belongs. It will be further understood that terms, such as those defined in commonly used dictionaries, should be interpreted as having a meaning that is consistent with their meaning in the context of the relevant art and/or the present specification, and should not be interpreted in an idealized or overly formal sense, unless expressly so defined herein.

FIG. 1 is a plan view illustrating a display device according to an embodiment.

Referring to FIG. 1, a display device DD may include a display area DA and a non-display area NDA. The non-display area NDA may be disposed to surround (e.g., around a periphery of) the display area DA. However, the non-display area NDA may be disposed to be adjacent to at least one side of the display area DA.

A plurality of pixels P may be disposed at (e.g., in or on) the display area DA. The plurality of pixels P may include a driving element (e.g., a transistor), and a light emitting element (e.g., an organic light emitting diode) connected to the driving element. The light emitting element may receive a signal from the driving element to emit light. As such, the display device DD may display an image by emitting light from the plurality of pixels P. Accordingly, the plurality of pixels P may be generally disposed at (e.g., in or on) the display area DA. For example, the plurality of pixels P may be arranged in a matrix form at (e.g., in or on) the display area DA.

A driving part (e.g., a driver) may be disposed at (e.g., in or on) the non-display area NDA. The driving part may include a data driving part (e.g., a data driver), a gate driving part (e.g., a gate driver or a scan driver), an emitting driving part (e.g., an emission driver), a power voltage generator, a timing controller, and/or the like. The plurality of pixels P may emit light based on a signal received from the driving part.

Figure 2:
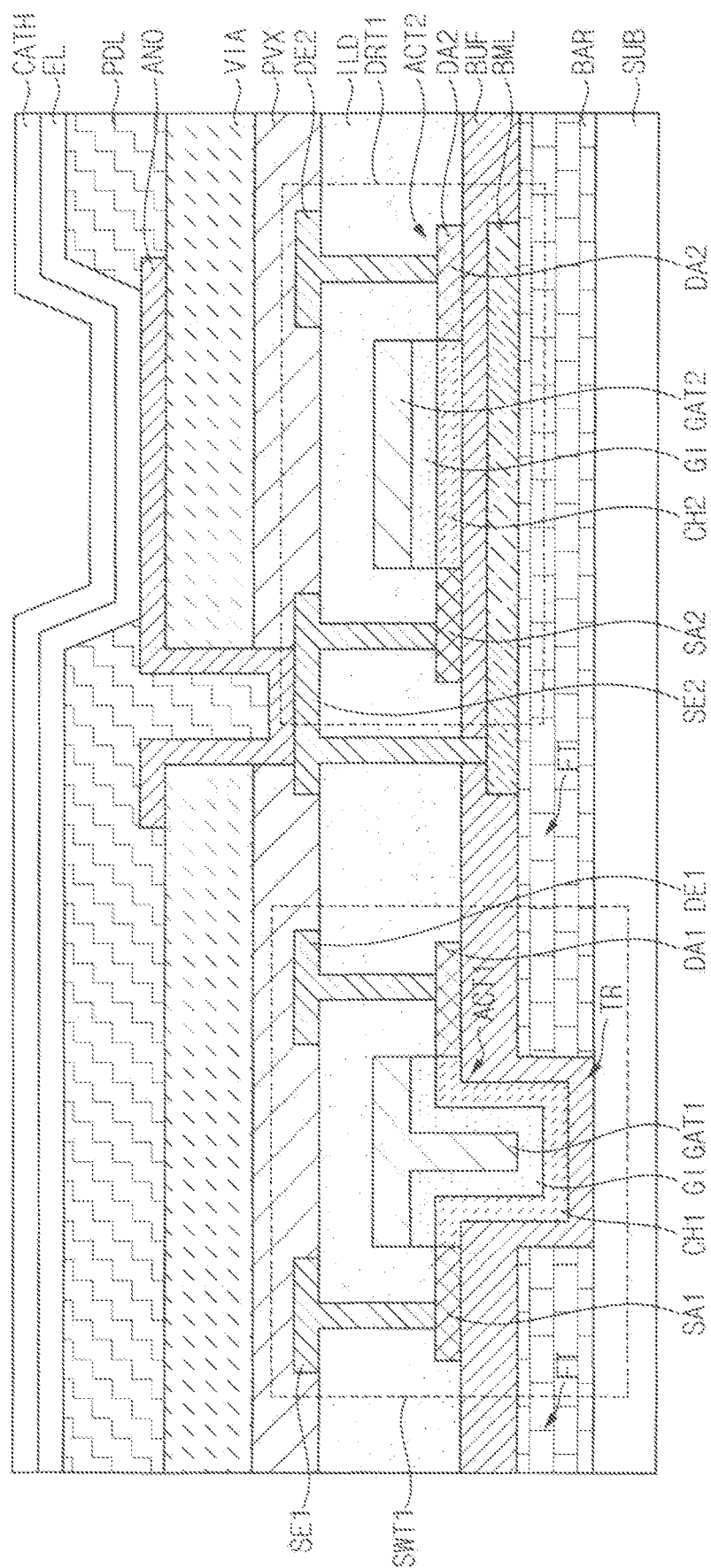
FIG. 2 is a cross-sectional view taken along the line I-I' of FIG. 1 according to an embodiment.

FIG. 2 is a cross-sectional view taken along the line I-I' of FIG. 1 according to an embodiment.

Referring to FIG. 1 and FIG. 2, the display device DD may include a substrate SUB, a barrier layer BAR, a lower electrode BML, a buffer layer BUF, a first switching transistor SWT1, a first driving transistor DRT1, a gate insulation layer GI, an interlayer insulation layer ILD, a passivation layer PVX, a via insulation layer VIA, a light emitting element, and a pixel defining layer PDL.

The first switching transistor SWT1 may include a first active layer ACT1, a first gate electrode GAT1, a first upper electrode SE1, and a second upper electrode DE1. The first driving transistor DRT1 may include a second active layer ACT2, a second gate electrode GAT2, a third upper electrode SE2, and a fourth upper electrode DE2. The light emitting element may include an anode electrode ANO, an light emitting layer EL, and a cathode electrode CATH.

The substrate SUB may include glass or plastic. When the substrate SUB is made of glass, the substrate SUB may have rigidity. However, even if the substrate SUB is made of glass, the substrate SUB may have ductility by patterning the glass. When the substrate SUB is made of plastic, the substrate SUB may have flexibility. An example of the plastic may include (e.g., may be) polyimide. In addition, various suitable materials may be used as the material of the substrate SUB.

The barrier layer BAR may be disposed on the substrate SUB. The barrier layer BAR may include a trench area TR, and a flat area FT surrounding (e.g., around a periphery of) the trench area TR. As shown in FIG. 2, in some embodiments, the trench area TR may penetrate through an entire thickness of the barrier layer BAR to expose the substrate SUB, but the present disclosure is not limited thereto. The barrier layer BAR may include an inorganic insulation material. Examples of the inorganic insulation material may include (e.g., may be) silicon oxide, silicon nitride, silicon oxynitride, and/or the like. These inorganic insulation materials may be used alone or in any suitable combinations with each other.

The lower electrode BML may be disposed on the flat area FT of the barrier layer BAR. The lower electrode BML may be connected to the first driving transistor DRT1 from under (e.g., underneath) the first driving transistor DRT1. Also, the lower electrode BML may be electrically connected to the anode electrode ANO. The lower electrode BML may transmit a signal to the driving element and/or the light emitting element. The lower electrode BML may include a metal, an alloy, a metal oxide, a transparent conductive material, and/or the like. Examples of the material that may be used as the lower electrode BML may include (e.g., may be) silver, an alloy containing silver, molybdenum, an alloy containing molybdenum, aluminum, an alloy containing aluminum, aluminum nitride, tungsten, tungsten nitride, copper, nickel, chromium, chromium nitride, titanium, tantalum, platinum, scandium, indium tin oxide, indium zinc oxide, and/or the like. These materials may be used alone or in any suitable combinations with each other.

The buffer layer BUF may be disposed on the barrier layer BAR to cover the lower electrode BML. The buffer layer BUF may be disposed at (e.g., in or on) the trench area TR. The buffer layer BUF may include an inorganic insulation material. Examples of the inorganic insulation material may include (e.g., may be) silicon oxide, silicon nitride, silicon oxynitride, and/or the like. These inorganic insulation materials may be used alone or in any suitable combinations with each other. The buffer layer BUF may prevent or substantially prevent metal atoms and/or impurities from diffusing into the first and second active layers ACT1 and ACT2. Also, the buffer layer BUF may control a rate of heat provided to the first and the second active layers ACT1 and ACT2 during a crystallization process for forming the first and second active layers ACT1 and ACT2.

The first active layer ACT1 and the second active layer ACT2 may be disposed on the buffer layer BUF. The first active layer ACT1 may include a first source area SA1, a first channel area CH1, and a first drain area DA1. The first source area SA1 and the first drain area DA1 may be disposed on the flat area FT. At least a portion of the first channel area CH1 may be disposed at (e.g., in or on) the trench area TR. As shown in FIG. 2, an entirety (e.g., all) of the first channel area CH1 may overlap with the trench area TR in a plan view. However, the present disclosure is not limited thereto. For example, at least a portion of the first channel area CH1 may overlap with the flat area FT.

The second active layer ACT2 may be disposed on the lower electrode BML. For example, the second active layer ACT2 may overlap with the lower electrode BML. Accordingly, the first driving transistor DRT1 may secure saturation and a driving range. The second active layer ACT2 may include a second source area SA2, a second channel area CH2, and a second drain area DA2. The second active layer ACT2 may have a flat or substantially flat shape.

Because the first channel area CH1 of the first active layer ACT1 is disposed at (e.g., in or on) the trench area TR, an area of the first switching transistor SWT1 in a plan view may be decreased, while a length of the first channel area CH1 is maintained or substantially maintained. Accordingly, the display device DD may include a reduced area of a pixel P in a plan view, while a performance of the first switching transistor SWT1 is maintained or substantially maintained.

The first and second active layers ACT1 and ACT2 may include a silicon semiconductor. Examples of the silicon semiconductor may include (e.g., may be) amorphous silicon, polycrystalline silicon, and/or the like. As another example, the first and second active layers ACT1 and ACT2 may include an oxide semiconductor. Examples of the oxide semiconductor may include (e.g., may be) indium-gallium-zinc oxide, indium-gallium oxide, indium-zinc oxide, and/or the like.

The gate insulation layer GI may be disposed on the first active layer ACT1 and the second active layer ACT2. The gate insulation layer GI may be disposed to overlap with only the first channel area CH1 and the second channel area CH2. The gate insulation layer GI overlapping with the first active layer ACT1 may be disposed at (e.g., in or on) the trench area TR. The gate insulation layer GI may include an inorganic insulation material. Examples of the inorganic insulation material may include (e.g., may be) silicon oxide, silicon nitride, silicon oxynitride, and/or the like. These inorganic insulation materials may be used alone or in any suitable combinations with each other.

The first gate electrode GAT1 and the second gate electrode GAT2 may be disposed on the gate insulation layer GI. The first gate electrode GAT1 and the second gate electrode GAT2 may be disposed to overlap with the gate insulation layer GI. Accordingly, in a process of forming the source and drain areas SA1, SA2, DA1, and DA2 by doping them with impurities, the first gate electrode GAT1 and the second gate electrode GAT2 may serve as masks. The first gate electrode GAT1 and the second gate electrode GAT2 may include a metal, an alloy, a metal oxide, a transparent conductive material, and/or the like. Examples of the material that may be used as the first gate electrode GAT1 and the second gate electrode GAT2 may include (e.g., may be) silver, an alloy containing silver, molybdenum, an alloy containing molybdenum, aluminum, an alloy containing aluminum, aluminum nitride, tungsten, tungsten nitride, copper, nickel, chromium, chromium nitride, titanium, tantalum, platinum, scandium, indium tin oxide, indium zinc oxide, and/or the like. These materials may be used alone or in any suitable combinations with each other.

The interlayer insulation layer ILD may be disposed on the buffer layer BUF to cover the first active layer ACT1, the second active layer ACT2, the first gate electrode GAT1, and the second gate electrode GAT2. For example, the interlayer insulation layer ILD may cover the source area SA1 and the drain area DA1 of the first active layer ACT1. As another example, the interlayer insulation layer ILD may cover the source area SA2 and the drain area DA2 of the second active layer ACT2. In this case, the interlayer insulation layer ILD may cover a side surface of the first gate electrode GAT1 and a side surface of the gate insulation layer GI. The interlayer insulation layer ILD may include an inorganic insulation material. Examples of the inorganic insulation material may include (e.g., may be) silicon oxide, silicon nitride, silicon oxynitride, and/or the like. These inorganic insulation materials may be used alone or in any suitable combinations with each other.

The first upper electrode SE1, the second upper electrode DE1, the third upper electrode SE2, and the fourth upper electrode DE2 may be disposed on the interlayer insulation layer ILD. The first upper electrode SE1 may be connected to the first source area SA1 through a contact hole. The second upper electrode DE2 may be connected to the first drain area DA1 thorough a contact hole. The third upper electrode SE2 may be connected to the second source area SA2 through a contact hole. The fourth upper electrode DE2 may be connected to the second drain area DA2 through a contact hole. The first upper electrode SE1 and the second upper electrode DE1 may be electrically connected to each other based on a signal applied to the first gate electrode GAT1. The third upper electrode SE2 and the fourth upper electrode DE2 may be electrically connected to each other based on a signal applied to the second gate electrode GAT2. The first upper electrode SE1, the second upper electrode DE1, the third upper electrode SE2, and the fourth upper electrode DE2 may include a metal, an alloy, a metal oxide, a transparent conductive material, and/or the like. Examples of the material that may be used as the first upper electrode SE1, the second upper electrode DE1, the third upper electrode SE2, and the fourth upper electrode DE2 may include (e.g., may be) silver, an alloy containing silver, molybdenum, an alloy containing molybdenum, aluminum, an alloy containing aluminum, aluminum nitride, tungsten, tungsten nitride, copper, nickel, chromium, chromium nitride, titanium, tantalum, platinum, scandium, indium tin oxide, indium zinc oxide, and/or the like. These materials may be used alone or in any suitable combinations with each other.

The passivation layer PVX may be disposed on the interlayer insulation layer ILD to cover the first upper electrode SE1, the second upper electrode DE1, the third upper electrode SE2, and the fourth upper electrode DE2. The passivation layer PVX may include an inorganic insulation material. Examples of the inorganic insulation material may include (e.g., may be) silicon oxide, silicon nitride, silicon oxynitride, and/or the like. These inorganic insulation materials may be used alone or in any suitable combinations with each other.

The via insulation layer VIA may be disposed on the passivation layer PVX. The via insulation layer VIA may include an organic insulation material. Examples of the organic insulation material may include (e.g., may be) a photoresist, a polyacrylic-type resin, a polyimide-type resin, an acrylic resin, and/or the like. These organic insulation materials may be used alone or in any suitable combinations with each other.

However, the present disclosure is not limited thereto, and in some embodiments, the passivation layer PVX may be omitted (e.g., may not be disposed). In this case, the via insulation layer VIA may be disposed on the interlayer insulation layer ILD to cover the first upper electrode SE1, the second upper electrode DE1, the third upper electrode SE2, and the fourth upper electrode DE2.

The anode electrode ANO may be disposed on the via insulation layer VIA. The anode electrode ANO may be connected to the first driving transistor DRT1 through a contact hole. For example, the anode electrode ANO may be connected to the third upper electrode SE2 through a contact hole. The anode electrode ANO may include a metal, an alloy, a metal oxide, a transparent conductive material, and/or the like. Examples of the material that may be used as the anode electrode ANO may include (e.g., may be) silver, an alloy containing silver, molybdenum, an alloy containing molybdenum, aluminum, an alloy containing aluminum, aluminum nitride, tungsten, tungsten nitride, copper, nickel, chromium, chromium nitride, titanium, tantalum, platinum, scandium, indium tin oxide, indium zinc oxide, and/or the like. These materials may be used alone or in any suitable combinations with each other.

The pixel defining layer PDL may be disposed on the via insulation layer VIA. An opening exposing the anode electrode ANO may be formed in the pixel defining layer PDL. The pixel defining layer PDL may include an organic insulation material.

The light emitting layer EL may be disposed on the anode electrode ANO and the pixel defining layer PDL. The light emitting layer EL may include an organic material for emitting light of a suitable color (e.g., a predetermined or preset color). For example, the light emitting layer EL may include an organic material for emitting blue light. In this case, the light emitting layer EL may have a structure in which a plurality of blue organic light emitting layers are stacked. For example, the light emitting layer EL may have a structure in which three blue organic light emitting layers are stacked.

As another example, the light emitting layer EL may have a structure in which a plurality of blue organic light emitting layers and an organic light emitting layer for emitting light of different colors are stacked. For example, the light emitting layer EL may have a structure in which three blue organic light emitting layers and one green organic light emitting layer are stacked.

The cathode electrode CATH may be disposed on the light emitting layer EL. The cathode electrode CATH may include a metal, an alloy, a metal oxide, a transparent conductive material, and/or the like. Examples of the material that may be used as the cathode electrode CATH may include (e.g., may be) silver, an alloy containing silver, molybdenum, an alloy containing molybdenum, aluminum, an alloy containing aluminum, aluminum nitride, tungsten, tungsten nitride, copper, nickel, chromium, chromium nitride, titanium, tantalum, platinum, scandium, indium tin oxide, indium zinc oxide, and/or the like. These materials may be used alone or in any suitable combinations with each other.

Figure 3:
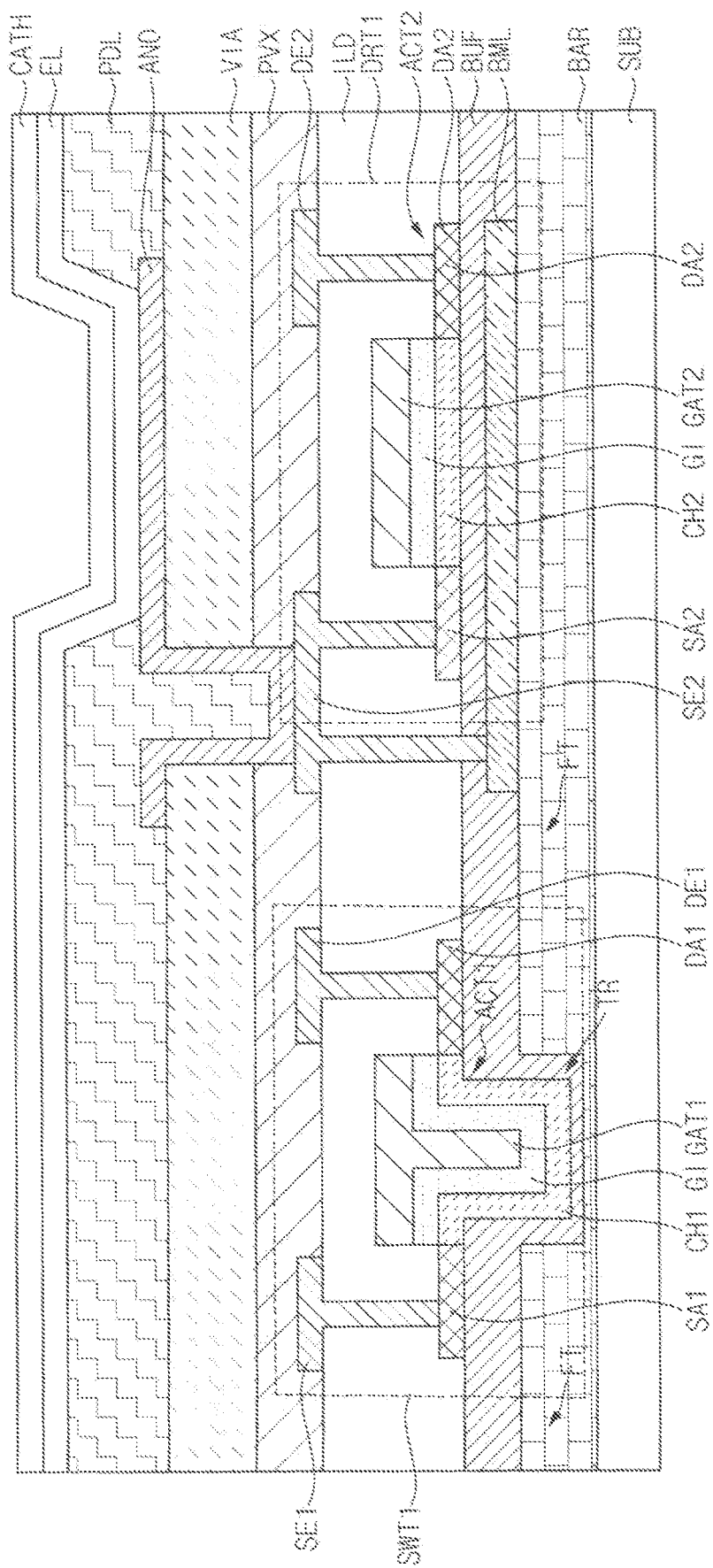
FIG. 3 is a cross-sectional view taken along the line I-I' of FIG. 1 according to another embodiment.

FIG. 3 is a cross-sectional view taken along the line I-I' of FIG. 1 according to another embodiment. FIG. 3 may be the same or substantially the same as FIG. 2, except that the trench area TR of the barrier layer BAR may not expose the substrate SUB. The other elements shown in FIG. 3, except the trench area TR, may be the same or substantially the same as those described above with reference to FIG. 2, and thus, redundant description thereof may not be repeated.

As shown in FIG. 3, in some embodiments, the trench area TR may partially penetrate through a thickness of the barrier layer BAR, such that the substrate SUB may not be exposed. While the active layers (e.g., the first active layer ACT1) are shown as being disposed at (e.g., in or on) the trench area TR of FIG. 2 and FIG. 3, not only the active layers but also other suitable elements may be disposed at (e.g., in or on) the trench area TR to reduce the area of the pixel in a plan view. For example, the display device DD may further include a capacitor, and electrodes included in the capacitor may be disposed at (e.g., in or on) the trench area TR.

FIG. 4 through FIG. 14 are cross-sectional views illustrating various processes of a method of manufacturing the display device of FIG. 1 according to an embodiment.

Figure 4:
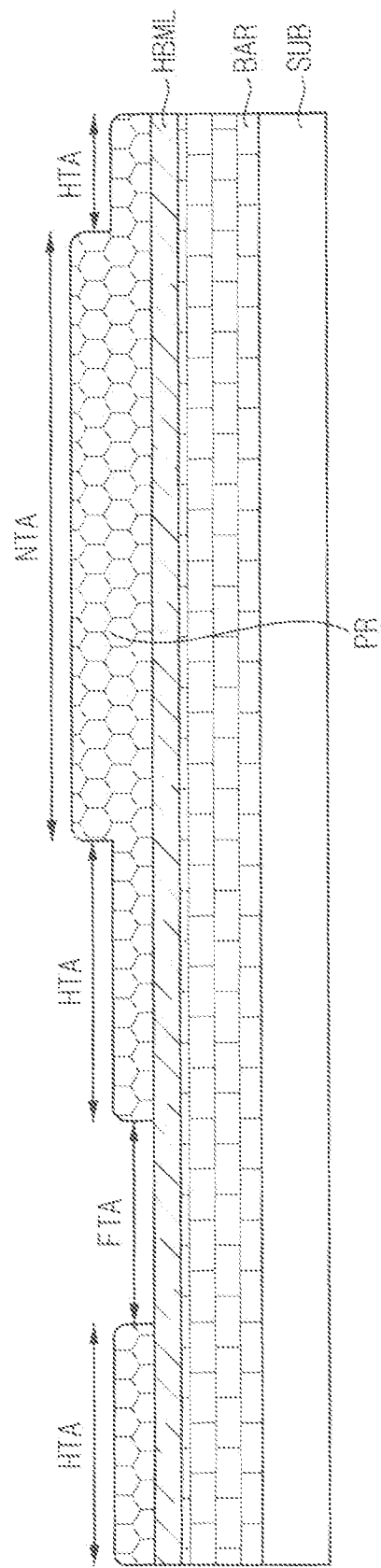
FIGS. 4-14 are cross-sectional views illustrating various processes of a method of manufacturing the display device of FIG. 1 according to an embodiment.

Referring to FIG. 4, the barrier layer BAR and a lower conductive layer HBML may be disposed on the substrate SUB. A photoresist layer PR may be disposed generally on the lower conductive layer HBML. The photoresist layer PR may be exposed using a halftone mask. The halftone mask may include a full-tone area, a half-tone area, and a no-tone area.

A first area FTA of the photoresist layer PR corresponding to the full-tone area may be removed through an exposure process and a developing process. A second area HTA of the photoresist layer PR corresponding to the half-tone area may be partially removed through the exposure process and the developing process. A third area NTA of the photoresist layer PR corresponding to the no-tone area may not be removed.

Figure 5:
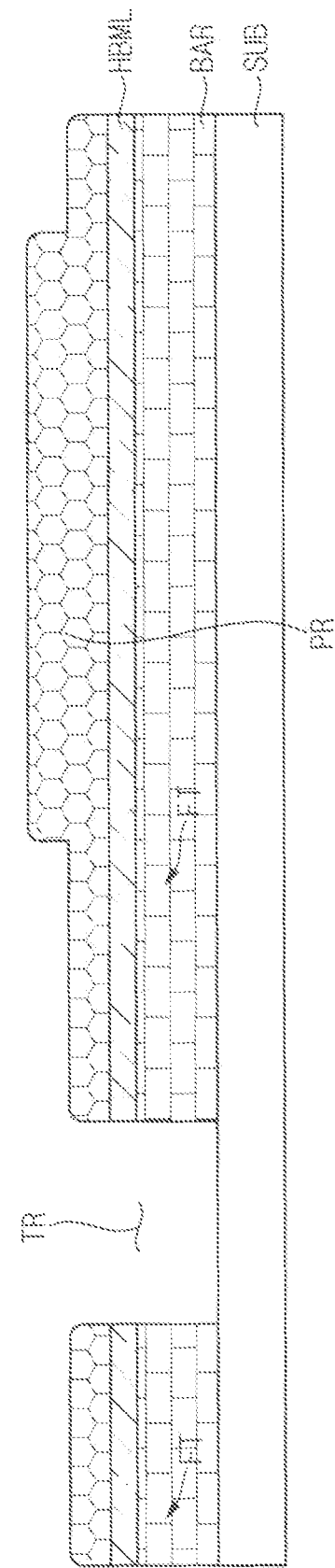

Referring to FIG. 4 and FIG. 5, an area of the barrier layer BAR and the lower conductive layer HBML overlapping with the first area FTA may be removed through an etching process. Accordingly, the trench area TR may be formed. The barrier layer BAR and the lower conductive layer HBML may be concurrently (e.g., simultaneously) etched with each other by the same or substantially the same process.

Figure 6:
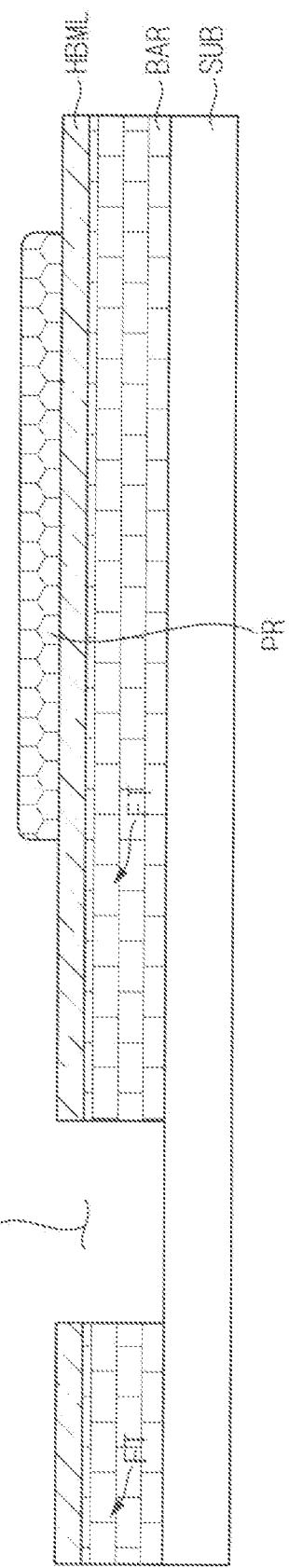

Referring to FIG. 4 and FIG. 6, the photoresist layer PR in the second area HTA may be removed. In this case, the photoresist layer PR in the third area NTA may be partially removed. The photoresist layer PR may be removed through an ashing process or a stripping process.

Figure 7:
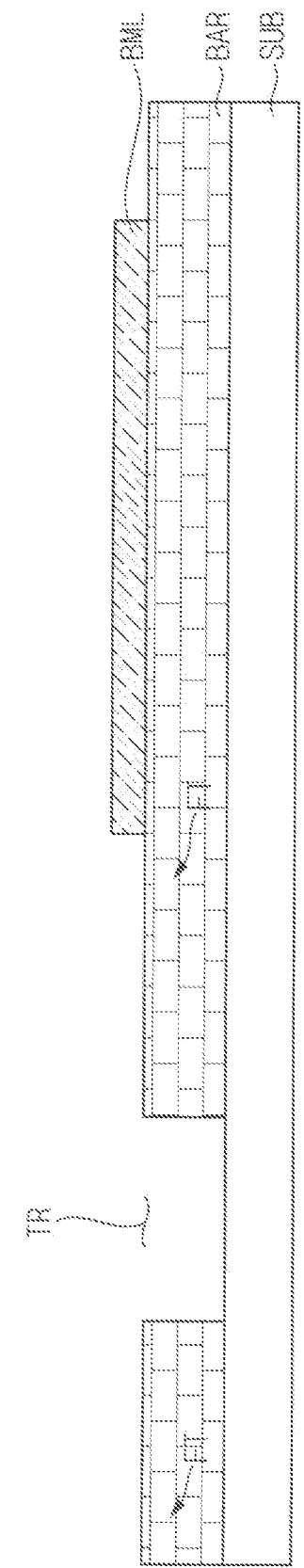

Referring to FIG. 4 and FIG. 7, the lower conductive layer HBML may be etched. In this case, the lower conductive layer HBML in the second area HTA may be etched, and the photoresist layer PR in the third area NTA may be etched. Accordingly, the lower electrode BML may be formed.

Figure 8:
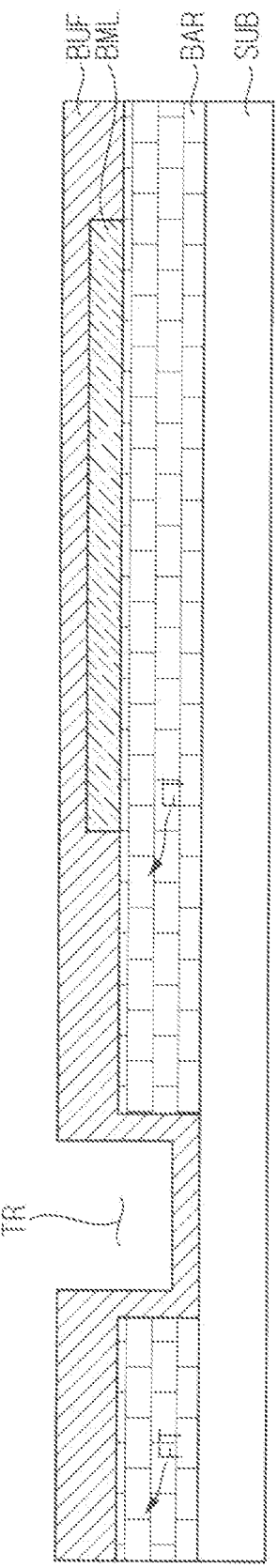

Referring to FIG. 8, the buffer layer BUF may be disposed generally on the flat area FT and the trench area TR. The buffer layer BUF may be disposed to cover the lower electrode BML. The buffer layer BUF may be disposed in the trench area TR along a profile of the trench area TR.

Figure 9:
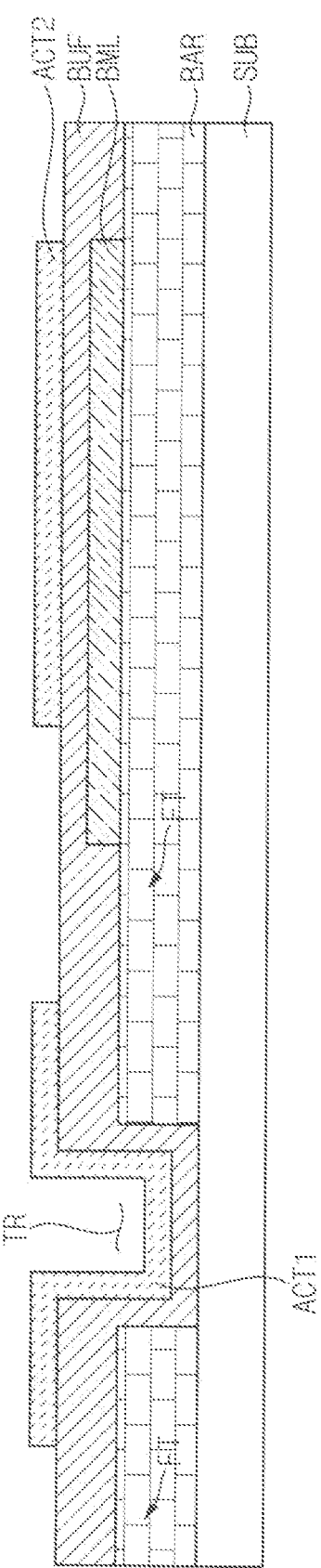

Referring to FIG. 9, the first active layer ACT1 and the second active layer ACT2 may be formed on the buffer layer BUF. The first active layer ACT1 and the second active layer ACT2 may be formed by patterning a semiconductor material applied on the buffer layer BUF. In this case, at least a portion of the first active layer ACT1 may be disposed in the trench area TR, and the second active layer ACT2 may be disposed to overlap with the lower electrode BML on the flat area FT. The first active layer ACT1 may be disposed in the trench area TR along the profile of the trench area TR, and the second active layer ACT2 may be disposed to have a flat or substantially flat shape.

Figure 10:
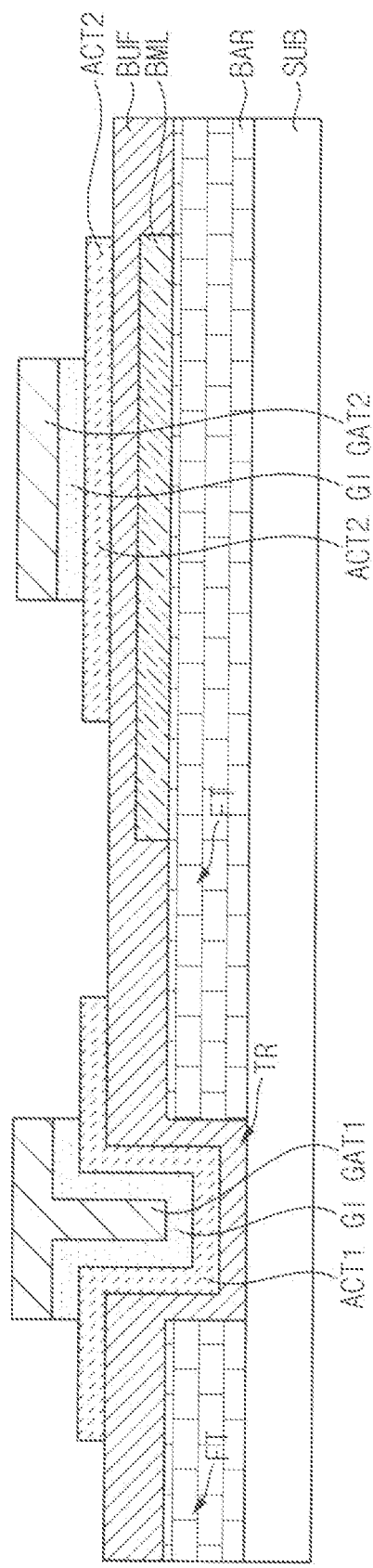

Referring to FIG. 10, the gate insulation layer GI, the first gate electrode GAT1, and the second gate electrode GAT2 may be formed. The gate insulation layer GI may be formed to overlap with a portion of the first active layer ACT1 on the first active layer ACT1, and may be formed to overlap with a portion of the second active layer ACT2 on the second active layer ACT2. The first gate electrode GAT1 may be formed to overlap with the portion of the first active layer ACT1 on the gate insulation layer GI, and the second gate electrode GAT2 may be formed to overlap with the portion of the second active layer ACT2 on the gate insulation layer GI.

Opposite ends of the first active layer ACT1 and opposite ends of the second active layer ACT2 may be doped with impurities. In this case, the first gate electrode GAT1 may serve as a mask when the first active layer ACT1 is doped with impurities, and the second gate electrode GAT2 may serve as a mask when the second active layer ACT2 is doped with impurities. Accordingly, only the opposite ends of the first active layer ACT1 and the opposite ends of the second active layer ACT2 may be doped with impurities. Thus, the first source area SA1, the first drain area DA1, the second source area SA2, and the second drain area DA2 may be formed.

Figure 11:
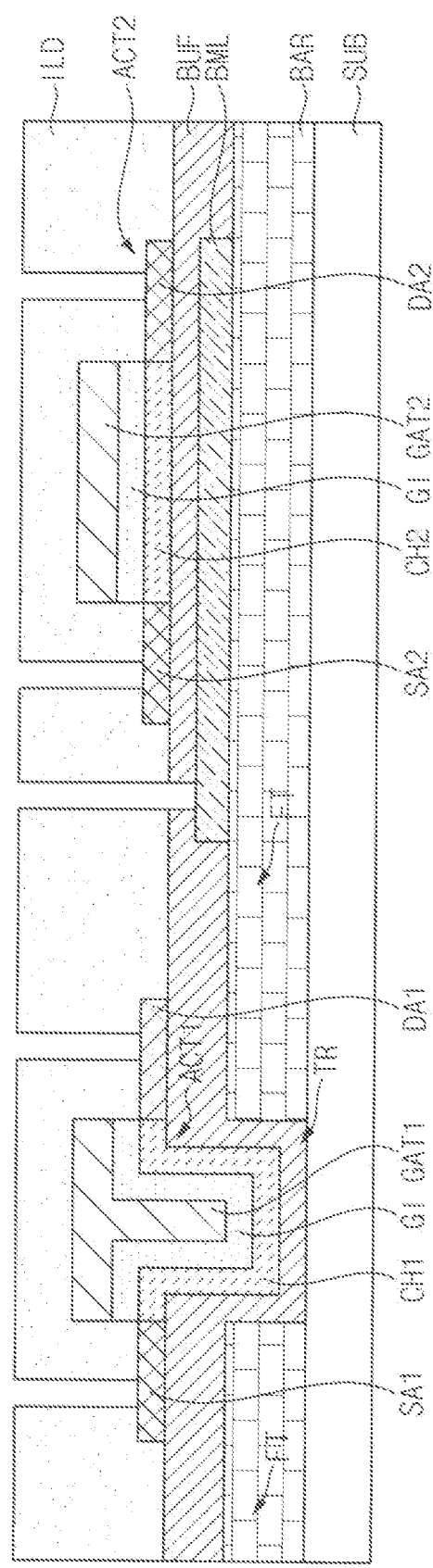

Referring to FIG. 11, the interlayer insulation layer ILD may be disposed on the buffer layer BUF. The interlayer insulation layer ILD may be disposed to cover the first source area SA1, the first drain area DA1, the second source area SA2, the second drain area DA2, the first gate electrode GAT1, and the second gate electrode GAT2. In this case, the interlayer insulation layer ILD may cover a side surface of the gate insulation layer GI. Contact holes exposing the first source area SA1, the first drain area DA1, the second source area SA2, and the second drain area DA2 may be formed in the interlayer insulation layer ILD.

Figure 12:
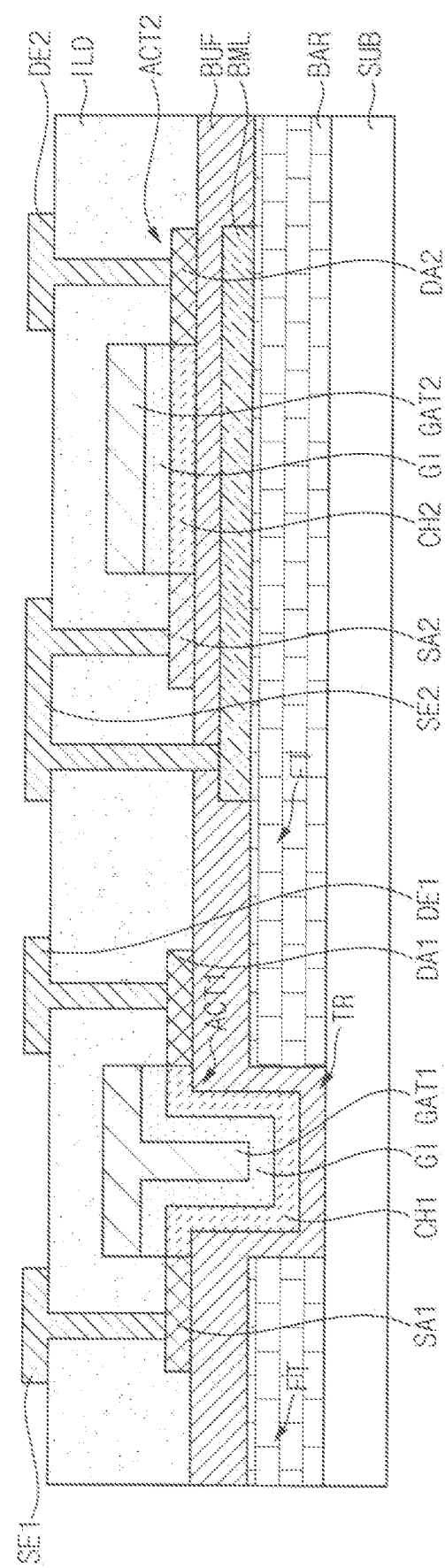

Referring to FIG. 12, the first upper electrode SE1, the second upper electrode DE1, the third upper electrode SE2, and the fourth upper electrode DE2 may be formed on the interlayer insulation layer ILD to fill the contact holes. The first upper electrode SE1, the second upper electrode DE1, the third upper electrode SE2, and the fourth upper electrode DE2 may be formed by patterning a conductive layer formed on the interlayer insulation layer ILD.

Figure 13:
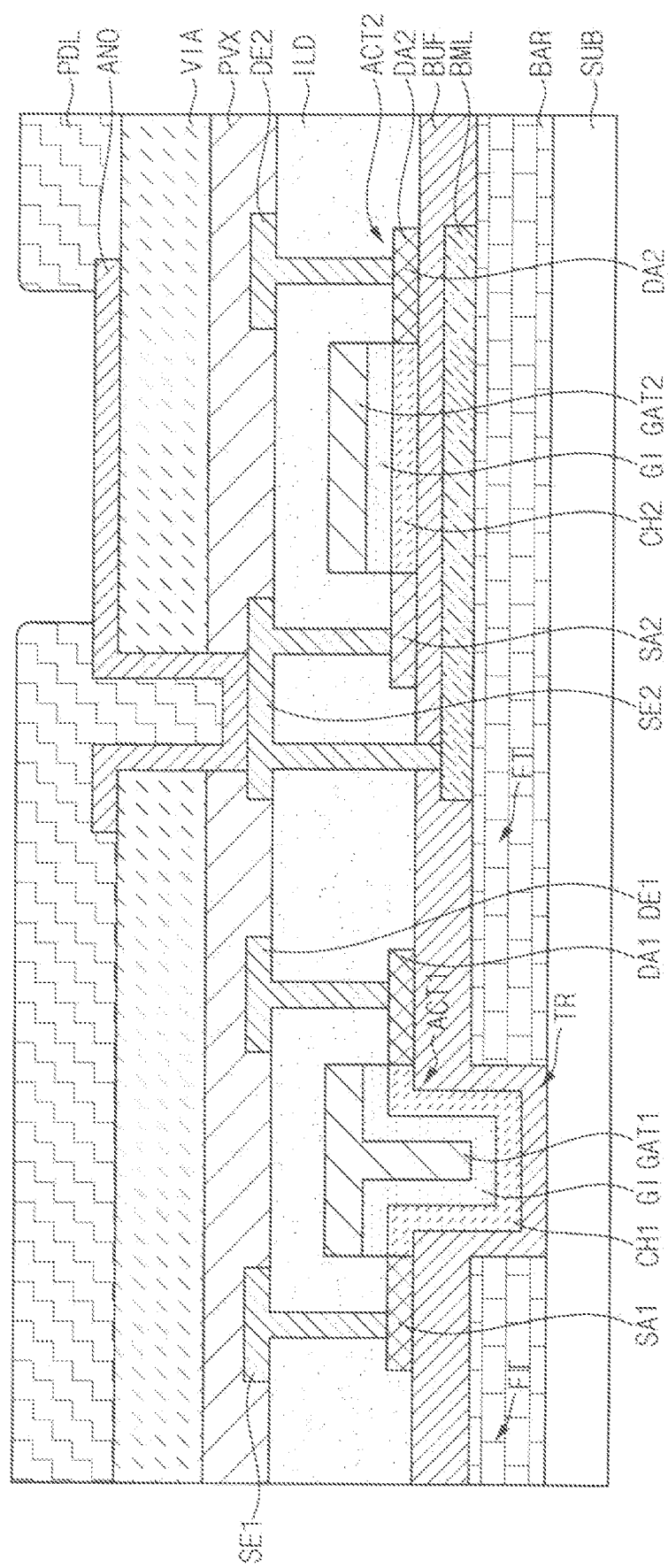

Referring to FIG. 13, the passivation layer PVX may be formed on the interlayer insulation layer ILD, and the via insulation layer VIA may be formed on the passivation layer PVX. Afterwards, a contact hole exposing the third upper electrode SE2 may be formed, and the anode electrode ANO may be formed on the via insulation layer VIA to fill the contact hole. The pixel defining layer PDL may be disposed on the via insulation layer VIA to define an opening exposing the anode electrode ANO.

Figure 14:
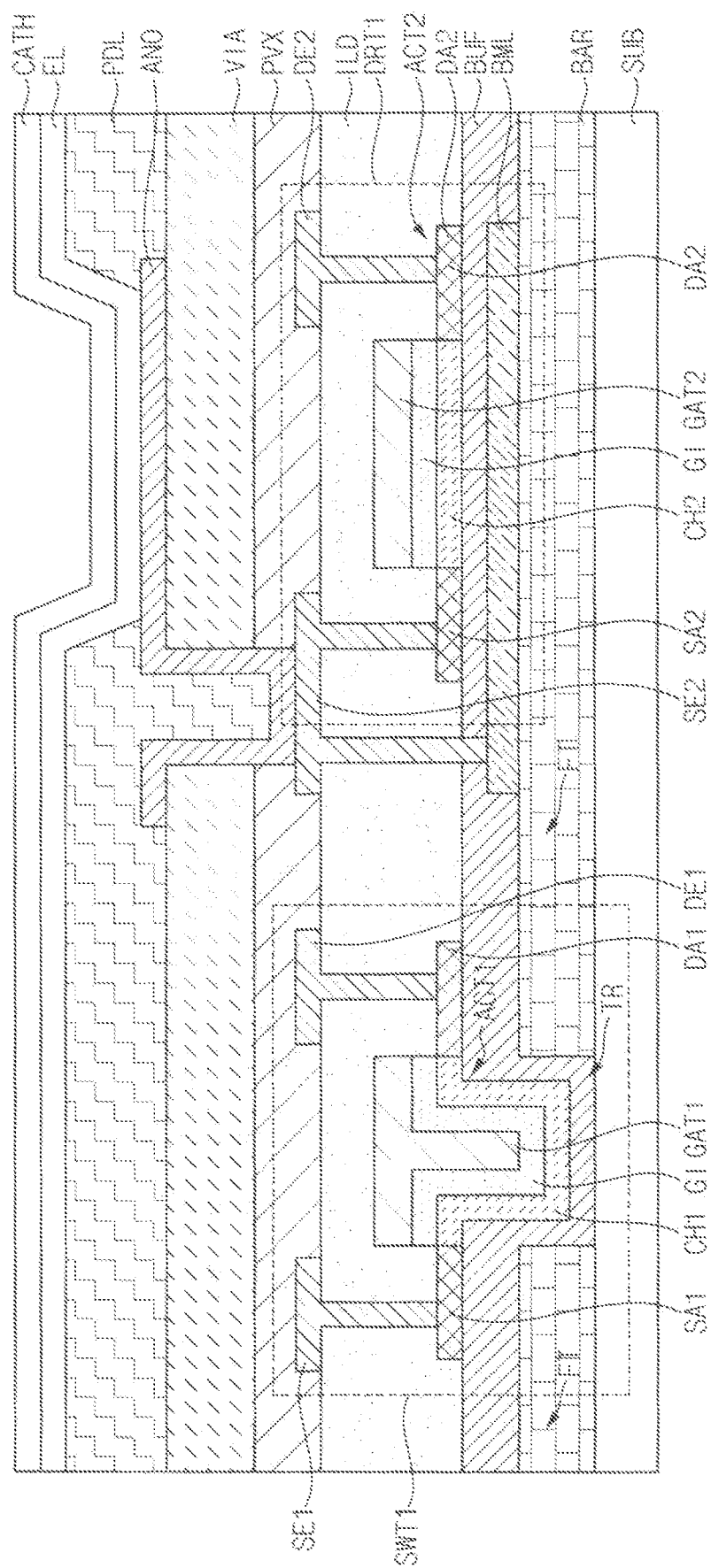

Referring to FIG. 14, the light emitting layer EL may be formed on the pixel defining layer PDL and the anode electrode ANO, and the cathode electrode CATH may be formed on the light emitting layer EL.

According to one or more embodiments of the method of manufacturing the display device, the first active layer ACT1 of the first switching transistor SWT1 may be disposed at (e.g., in or on) the trench area TR along the profile of the trench area TR. Accordingly, the area of the first switching transistor SWT1 in a plan view may be decreased, while a length of the first channel area CH1 may be maintained or substantially maintained. Accordingly, the area of the pixel P in a plan view may be reduced, and more pixels P may be disposed in the same area (e.g., in the same sized area).

Figure 15:
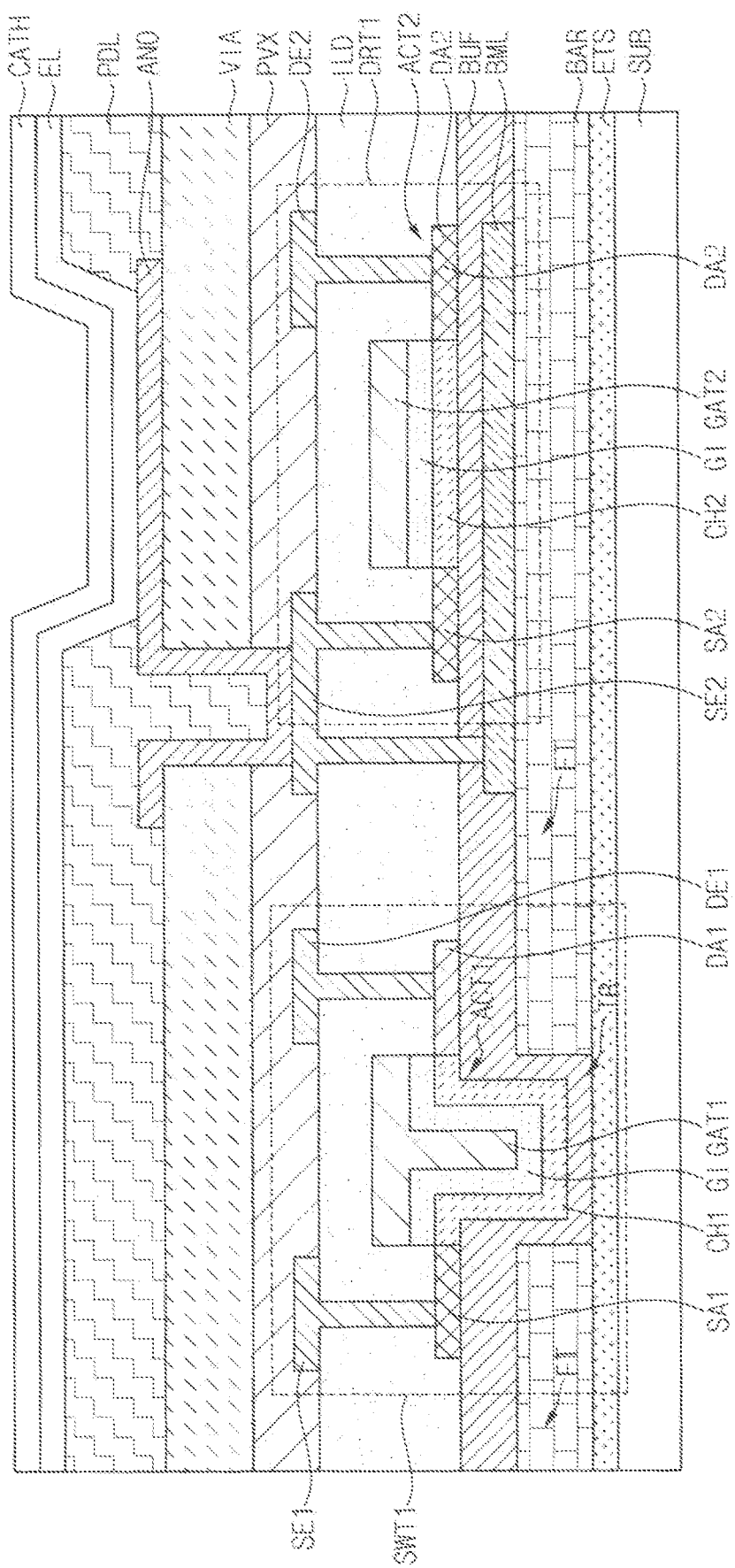
FIG. 15 is a cross-sectional view taken along the line I-I' of FIG. 1 according to another embodiment.

FIG. 15 is a cross-sectional view taken along the line I-I' of FIG. 1 according to another embodiment. FIG. 15 may be the same or substantially the same as FIG. 2, except that an etch stopper ETS is further included. The other elements shown in FIG. 15, except the etch stopper ETS, may be the same or substantially the same as those described above with reference to FIG. 2, and thus, redundant description thereof may not be repeated, and the differences between the embodiments of FIG. 2 and FIG. 15 may be mainly described hereinafter.

Referring to FIG. 15, in some embodiments, the etch stopper ETS may be further disposed between the substrate SUB and the barrier layer BAR. Accordingly, when the trench area TR is formed in the barrier layer BAR, the etch stopper ETS may prevent or substantially prevent damage to the substrate SUB due to over-etching. In addition, the etch stopper ETS may serve to assist the trench area TR to have a uniform or substantially uniform depth.

In an embodiment, the etch stopper ETS may include an inorganic insulation material. Examples of the inorganic insulation material may include (e.g., may be) silicon oxide, silicon nitride, silicon oxynitride, and/or the like. These inorganic insulation materials may be used alone or in any suitable combinations with each other. As another example, the etch stopper ETS may include an oxide. Examples of the oxide may include (e.g., may be) indium oxide, gallium oxide, zinc oxide, hafnium oxide, titanium oxide, zirconium oxide, and/or the like. These oxides may be used alone or in any suitable combinations with each other.

FIG. 16 through FIG. 26 are cross-sectional views illustrating various processes of a method of manufacturing the display device of FIG. 1 according to another embodiment.

Figure 16:
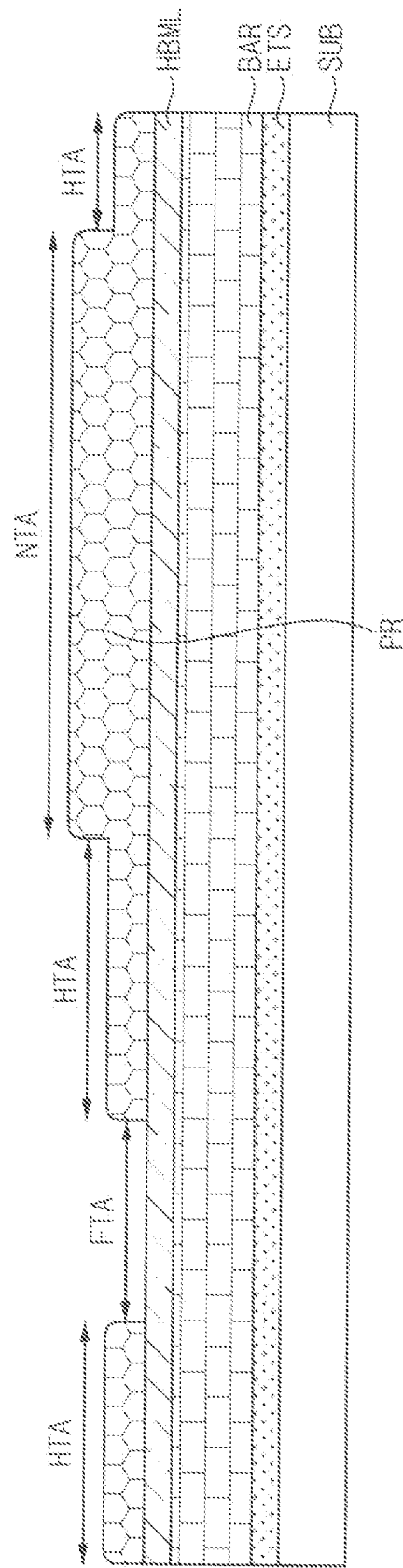
FIGS. 16-26 are cross-sectional views illustrating various processes of a method of manufacturing the display device of FIG. 1 according to another embodiment.
Figure 17:
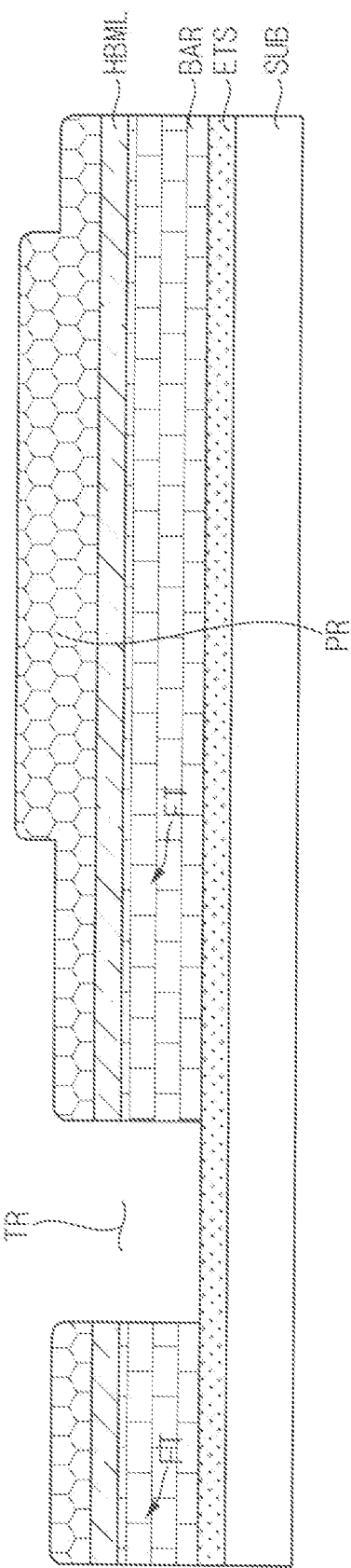
Figure 18:
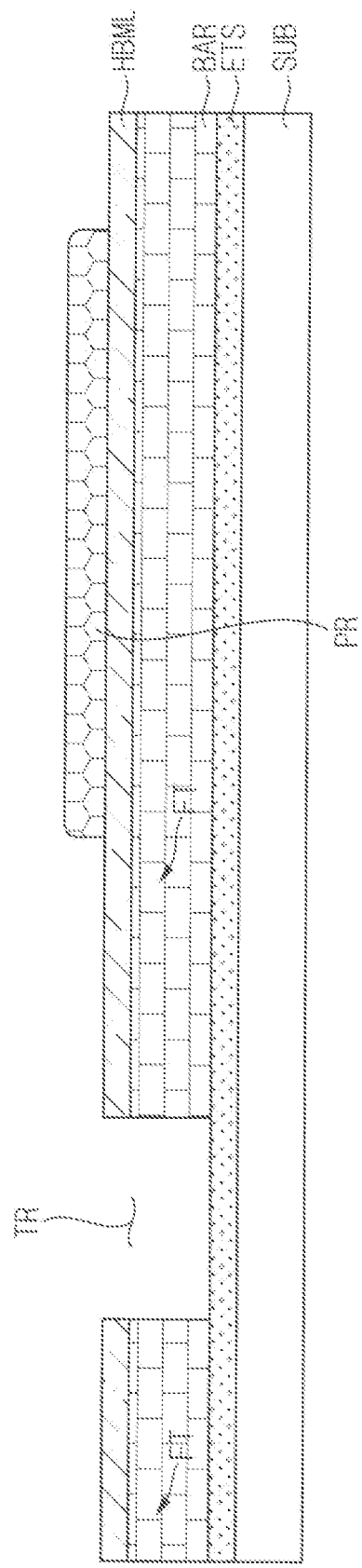
Figure 19:
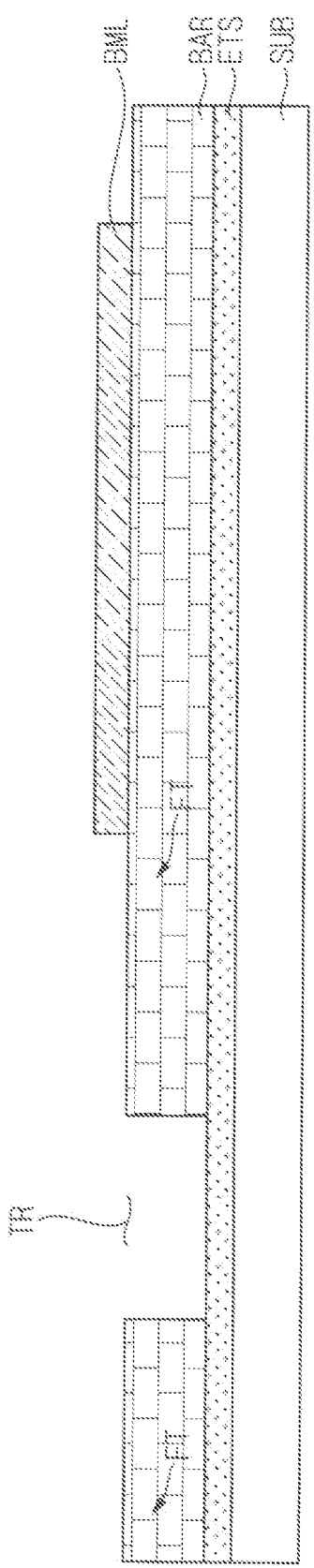
Figure 20:
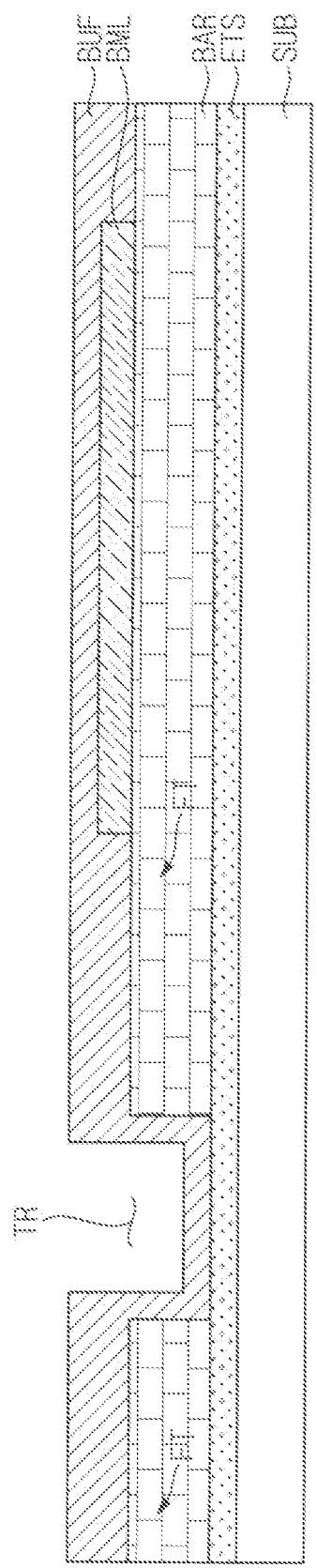
Figure 21:
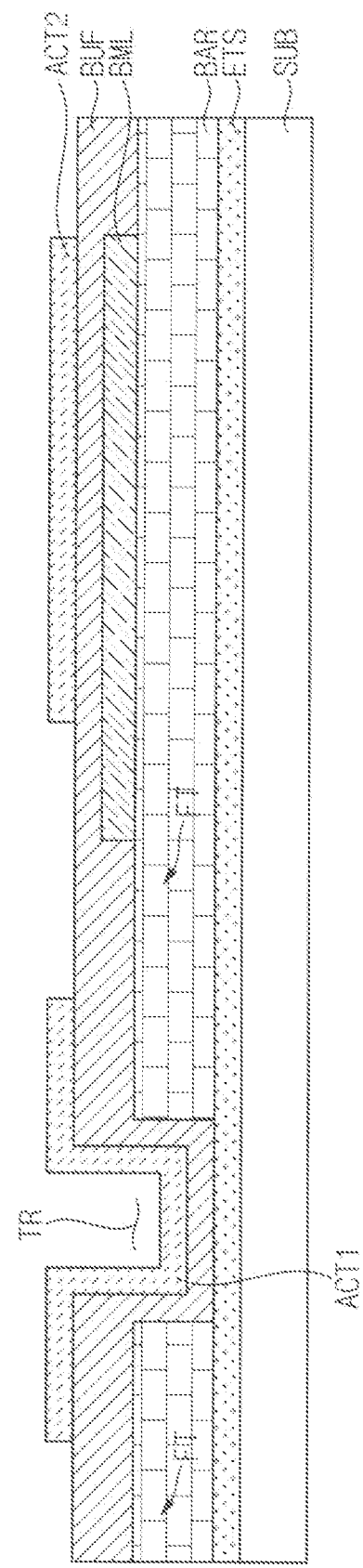
Figure 22:
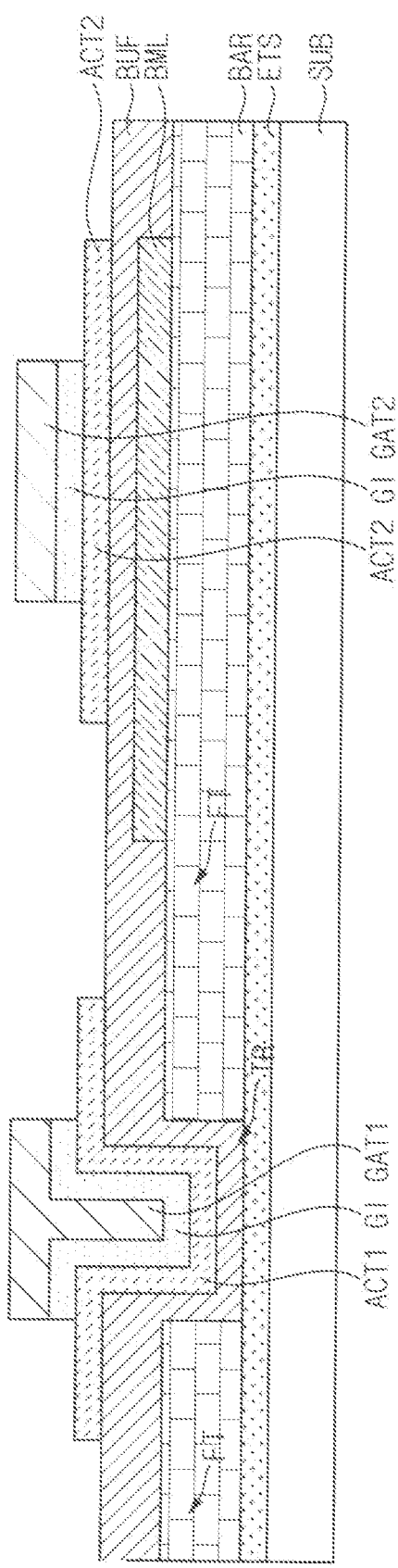
Figure 23:
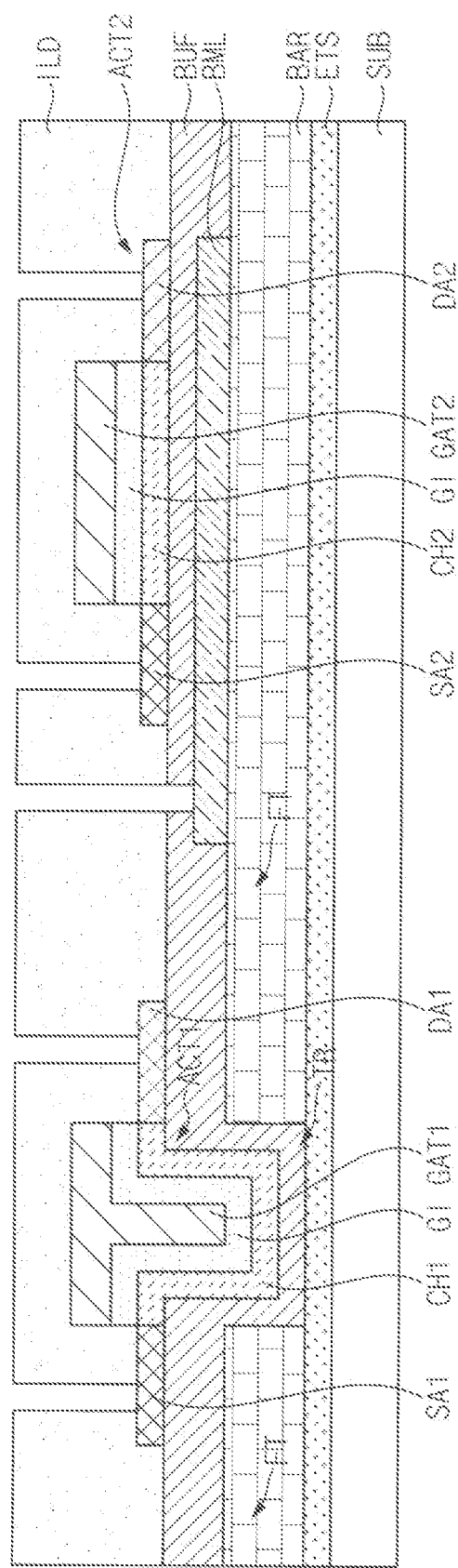
Figure 24:
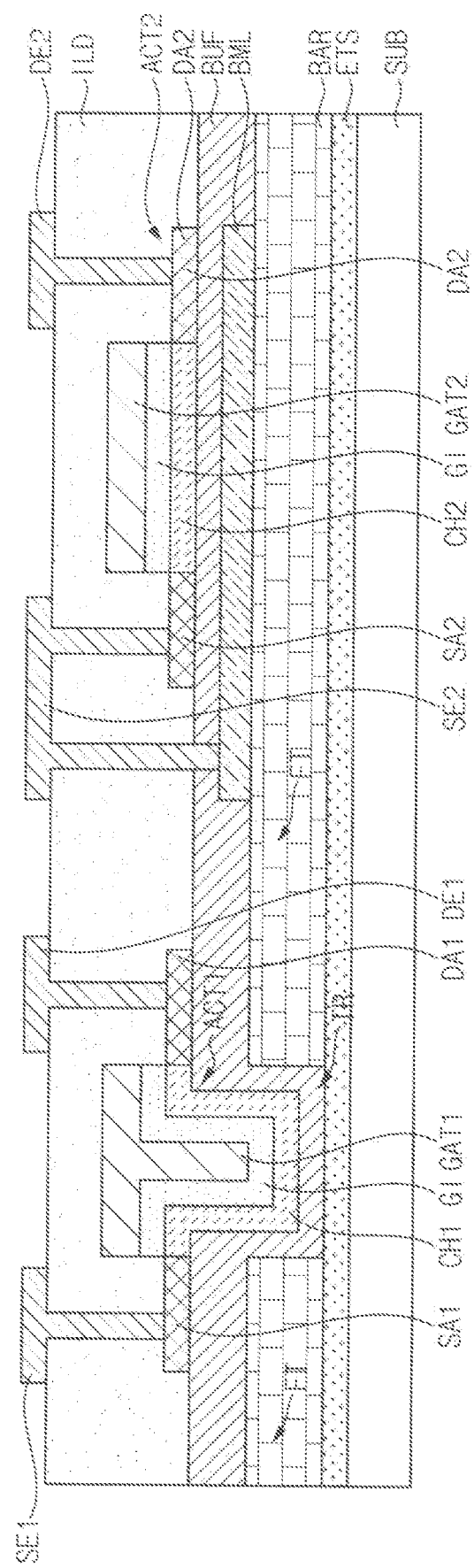
Figure 25:
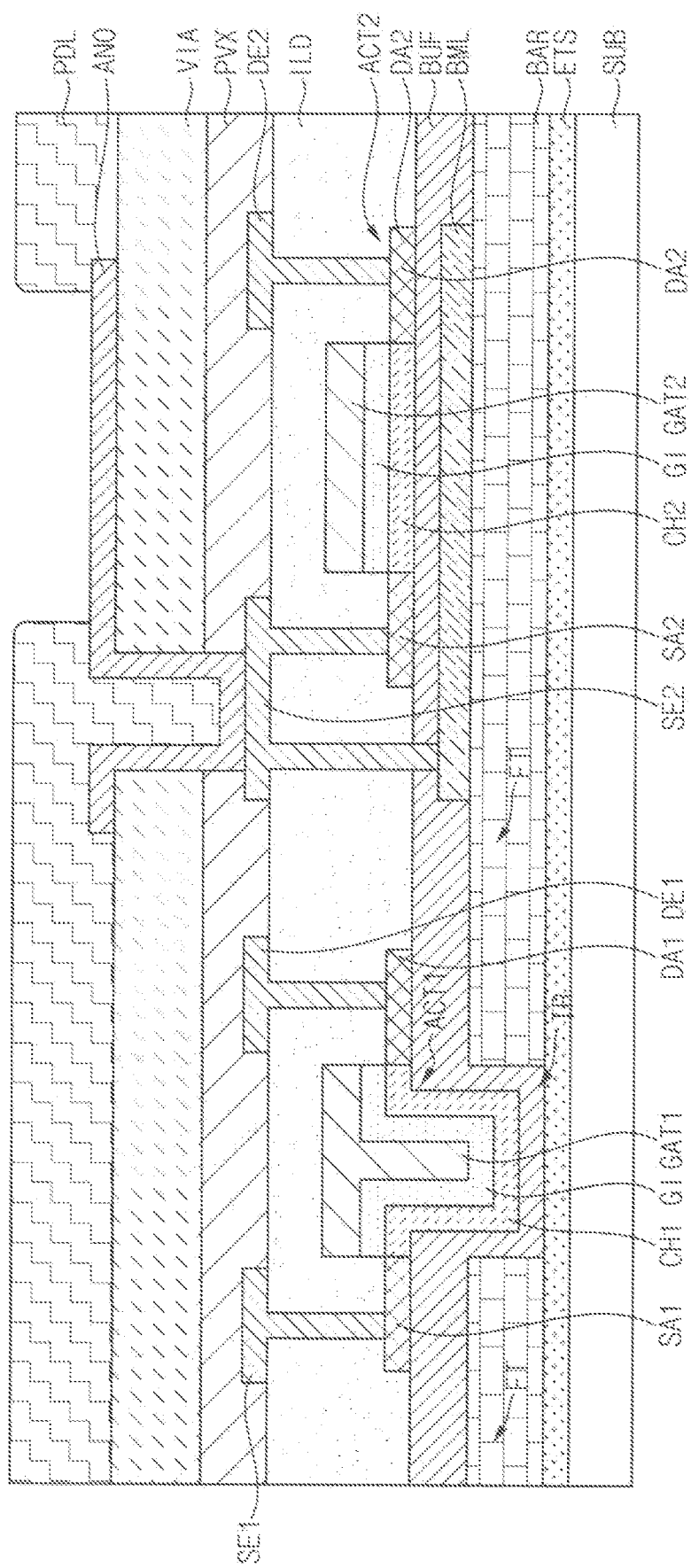
Figure 26:
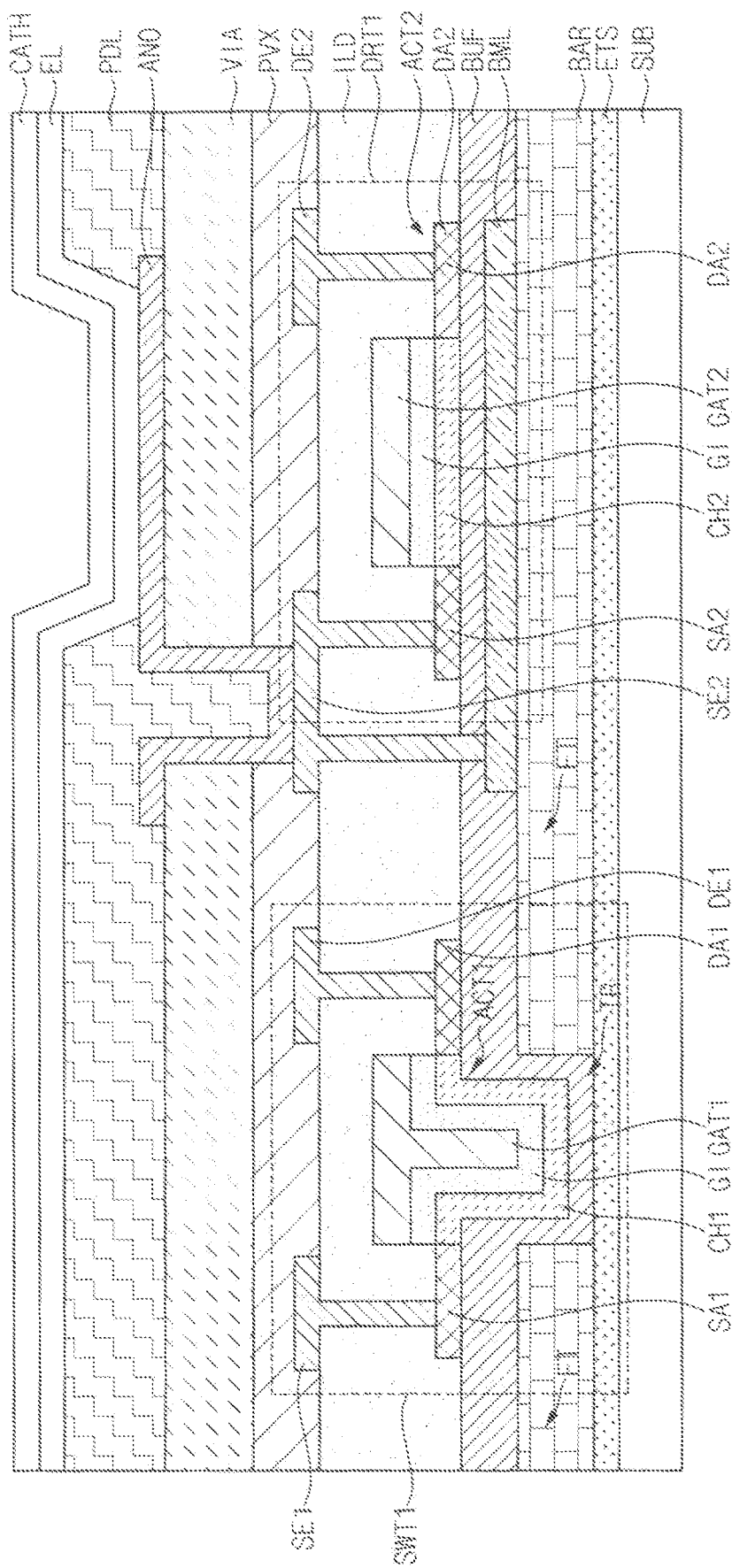

The method shown in FIG. 16 through FIG. 26 may be the same or substantially the same as the method shown in FIG. 4 through FIG. 14, except that the etch stopper ETS is further formed. For example, as shown in FIG. 16, the etch stopper ETS, the barrier layer BAR, and a lower conductive layer HBML may be disposed on the substrate SUB, and a photoresist layer PR may be disposed generally on the lower conductive layer HBML Thereafter, the method shown in FIG. 16 through FIG. 26 may be the same or substantially the same as the method described above with reference to FIG. 4 through FIG. 14, and thus, redundant description thereof will not be repeated.

Figure 27:
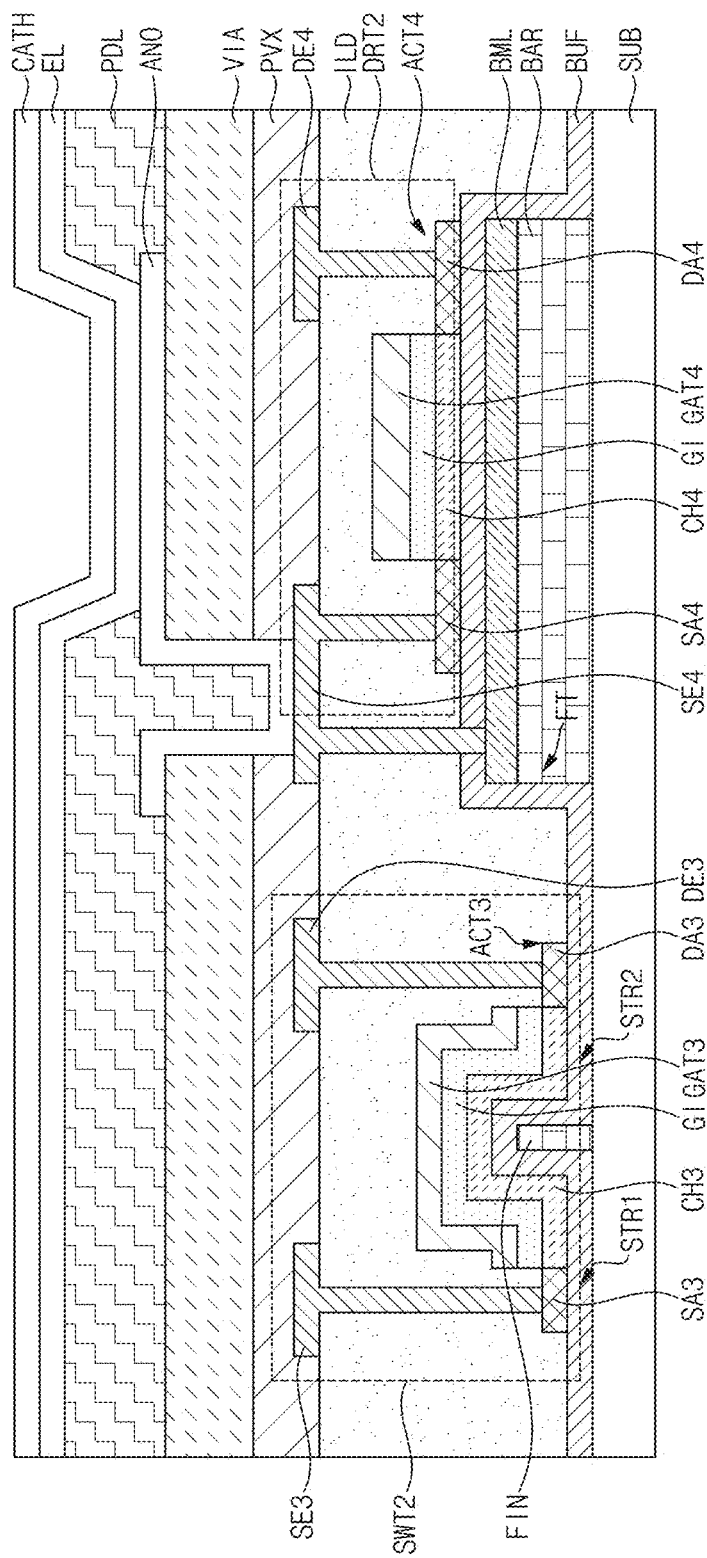
FIG. 27 is a cross-sectional view taken along the line I-I' of FIG. 1 according to another embodiment.

FIG. 27 is a cross-sectional view taken along the line I-I' of FIG. 1 according to another embodiment.

Referring to FIG. 1 and FIG. 27, the display device DD may include a substrate SUB, a barrier layer BAR, a lower electrode BML, a buffer layer BUF, a second switching transistor SWT2, a second driving transistor DRT2, a gate insulation layer GI, an interlayer insulation layer ILD, a passivation layer PVX, a via insulation layer VIA, a light emitting element, and a pixel defining layer PDL.

The second switching transistor SWT2 may include a third active layer ACT3, a third gate electrode GAT3, a fifth upper electrode SE3, and a sixth upper electrode DE3. The second driving transistor DRT2 may include a fourth active layer ACT4, a fourth gate electrode GAT4, a seventh upper electrode SE4, and an eight upper electrode DE4. The light emitting element may include an anode electrode ANO, a light emitting layer EL, and a cathode electrode CATH.

The barrier layer BAR may be disposed on the substrate SUB. The barrier layer BAR may include a trench area and a flat area FT. The trench area may include a first sub trench area STR1, a second sub trench area STR2, and a fin area FIN. The fin area FIN may be disposed between the first sub trench area STR1 and the second sub trench area STR2. As shown in FIG. 27, in some embodiments, the first sub trench area STR1 and the second sub trench area STR2 may penetrate through an entire thickness of the barrier layer BAR to expose the substrate SUB, but the present disclosure is not limited thereto.

The lower electrode BML may be disposed on the barrier layer BAR. The lower electrode BML may be disposed on the flat area FT of the barrier layer BAR.

The buffer layer BUF may be disposed on the substrate SUB and the barrier layer BAR. The buffer layer BUF may be disposed to cover the trench area and the flat area FT.

The third active layer ACT3 may be disposed on the buffer layer BUF. The third active layer ACT3 may include a third source area SA3, a third channel area CH3, and a third drain area DA3. The third channel area CH3 may be disposed to cover the fin area FIN. In this case, a portion of the third channel area CH3 may be disposed at (e.g., in or on) the first sub trench area STR1, and another portion of the third channel area CH3 may be disposed at (e.g., in or on) the second sub trench area STR2. As such, the third channel area CH3 covers the fin area FIN, and is disposed at (e.g., in or on) the first and second sub trench areas STR1 and STR2, so that an area of the third channel area CH3 in a plan view may be decreased while a length of the third channel area CH3 is maintained or substantially maintained. Accordingly, an area of the pixel P in a plan view may be reduced, and more pixels P may be disposed in the same area (e.g., the same sized area).

The fourth active layer ACT4 may be disposed on the buffer layer BUF. The fourth active layer ACT4 may include a fourth source area SA4, a fourth channel area CH4, and a fourth drain area DA4. The fourth active layer ACT4 may be disposed on the flat area FT. Accordingly, the fourth active layer ACT4 may have a flat or substantially flat shape. The fourth active layer ACT4 may be disposed to overlap with the lower electrode BML. Accordingly, the second driving transistor DRT2 may secure saturation and a driving range.

The gate insulation layer GI and the third gate electrode GAT3 may be disposed on the third active layer ACT3 to overlap with the third channel area CH3. In addition, the gate insulation layer GI and the fourth gate electrode GAT4 may be disposed on the fourth active layer ACT4 to overlap with the fourth channel area CH4.

The interlayer insulation layer ILD may be disposed to cover the third source area SA3, the third gate electrode GAT3, the third drain area DA3, the fourth source area SA4, the fourth gate electrode GAT4, and the fourth drain electrode DA4. In this case, the interlayer insulation layer ILD may cover a side surface of the gate insulation layer GI.

The fifth upper electrode SE3, the sixth upper electrode DE3, the seventh upper electrode SE4, and the eight upper electrode DE4 may be disposed on the interlayer insulation layer ILD. The fifth upper electrode SE3 and the sixth upper electrode DE3 may be connected to the third source area SA3 and the third drain area DA3 through contact holes. The seventh upper electrode SE4 and the eight upper electrode DE4 may be connected to the fourth source area SA4 and the fourth drain area DA4 through contact holes.

The passivation layer PVX, the via insulation layer VIA, the light emitting element, and the pixel defining layer PDL illustrated in FIG. 27 may be the same or substantially the same as the passivation layer PVX, the via insulation layer VIA, the light emitting element, and the pixel defining layer PDL described above with reference to FIG. 2, and thus, redundant description thereof will not be repeated.

Figure 28:
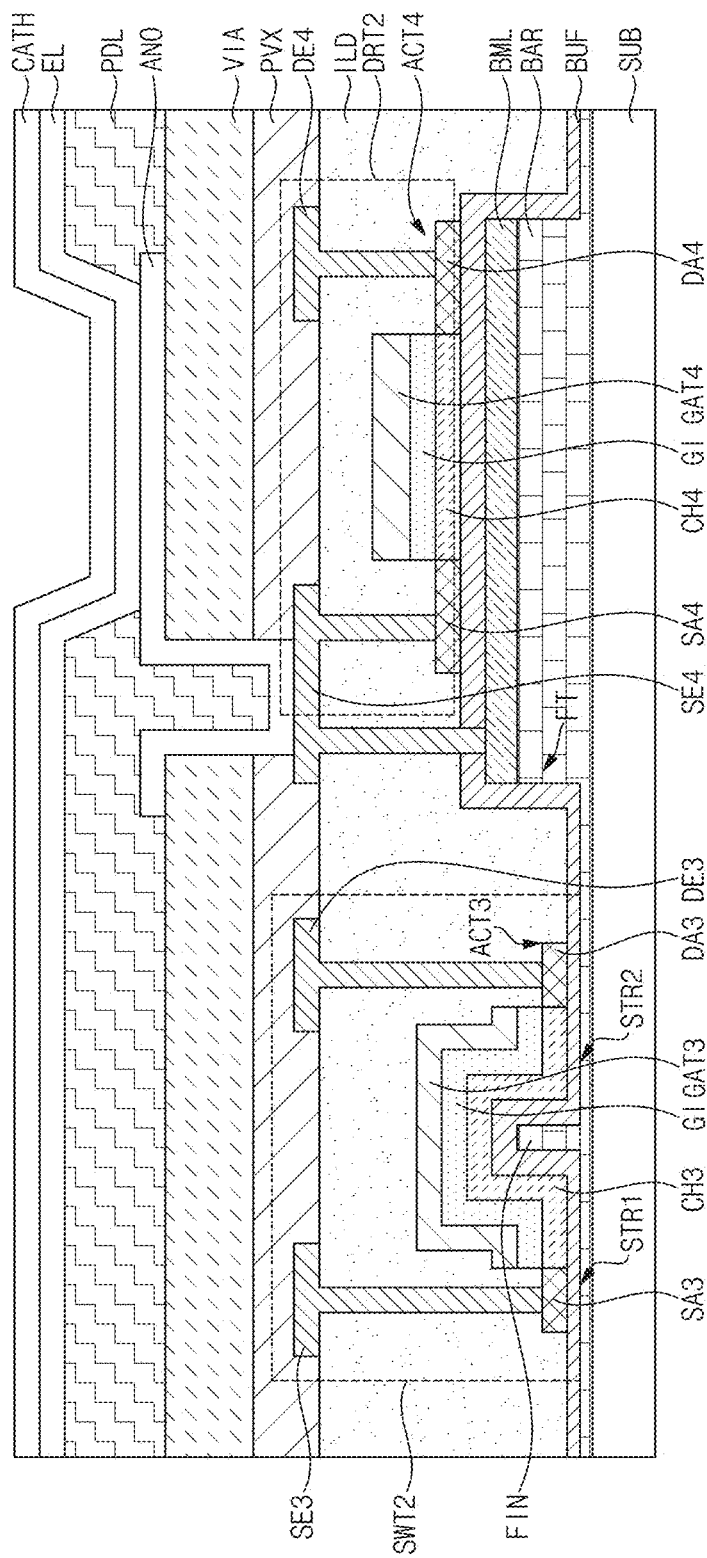
FIG. 28 is a cross-sectional view taken along the line I-I' of FIG. 1 according to another embodiment.

FIG. 28 is a cross-sectional view taken along the line I-I' of FIG. 1 according to another embodiment. FIG. 28 may be the same or substantially the same as FIG. 27, except that the first and second sub trench areas STR1 and STR2 may not expose the substrate SUB. The other elements shown in FIG. 28, except the first and second sub trench areas STR1 and STR2, may be the same or substantially the same as those described above with reference to FIG. 27, and thus, redundant description thereof may not be repeated.

As shown in FIG. 28, in some embodiments, the first and second sub trench areas STR1 and STR2 may partially penetrate through a thickness of the barrier layer BAR, such that the substrate SUB may not be exposed.

FIG. 29 through FIG. 36 are cross-sectional views illustrating various processes of a method of manufacturing the display device of FIG. 1 according to another embodiment.

Figure 29:
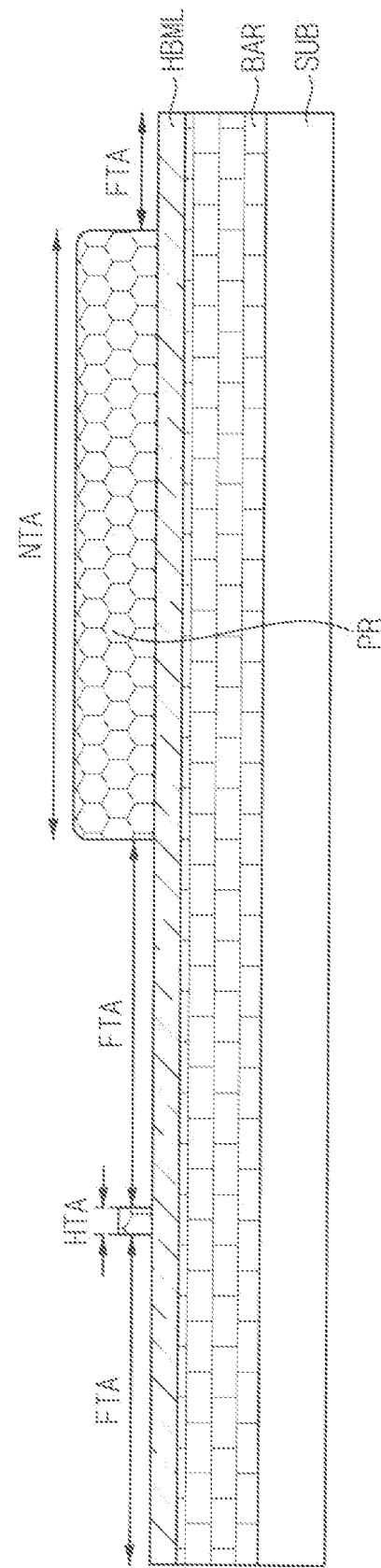
FIGS. 29-36 are cross-sectional views illustrating various processes of a method of manufacturing the display device of FIG. 1 according to another embodiment.

Referring to FIG. 29, the barrier layer BAR and a lower conductive layer HBML may be sequentially stacked on the substrate SUB. A photoresist layer PR is generally formed on the lower conductive layer HBML, and the photoresist layer PR may be exposed by using a halftone mask to be selectively removed through a developing process. The halftone mask may include a full-tone area, a half-tone area, and a no-tone area.

A first area FTA of the photoresist layer PR corresponding to the full-tone area may be exposed to be completely removed through an exposure process and the developing process. A second area HTA of the photoresist layer PR corresponding to the half-tone area may be exposed to be partially removed through the exposure process and the developing process. A third area NTA of the photoresist layer PR corresponding to the no-tone area may be exposed to not be removed through the exposure process and the developing process.

Figure 30:
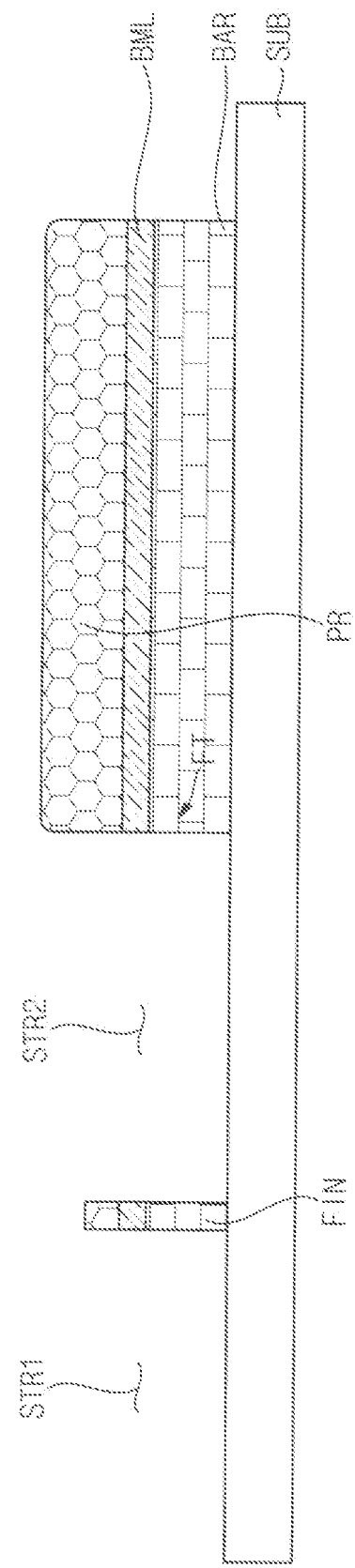

Referring to FIG. 30, the barrier layer BAR and the lower conductive layer HBML may be removed in an area overlapping with the first area FTA through an etching process. Accordingly, the trench area and the flat area FT may be formed in the barrier layer BAR. The trench area may include the first sub-trench area STR1, the second sub-trench area STR2, and the fin area FIN. The barrier layer BAR and the lower conductive layer HBML may be concurrently (e.g., simultaneously) etched with each other by the same or substantially the same process.

Figure 31:
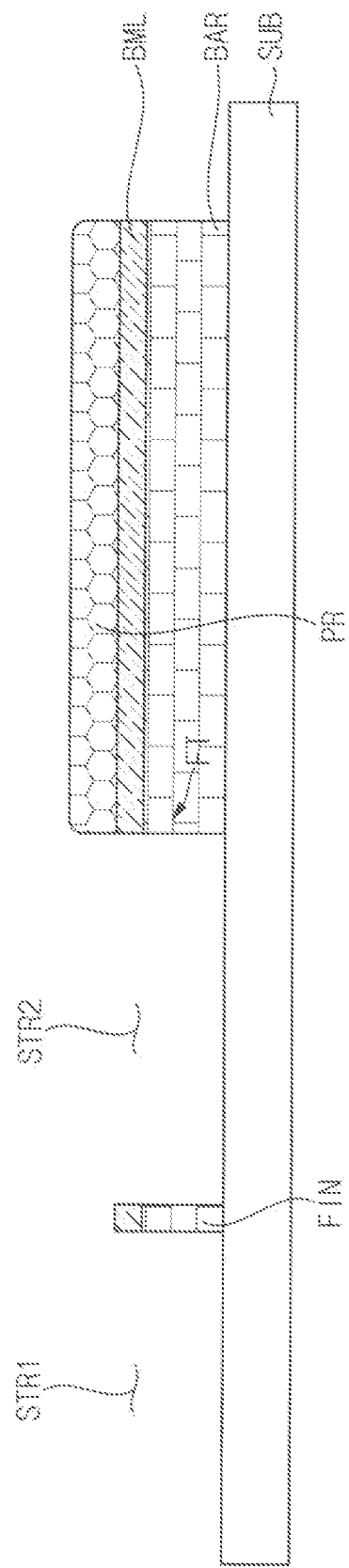

Referring to FIG. 31, the photoresist layer PR in the second area HTA may be completely removed, and the photoresist layer PR in the third area NTA may be partially removed through an ashing process or a stripping process.

Figure 32:
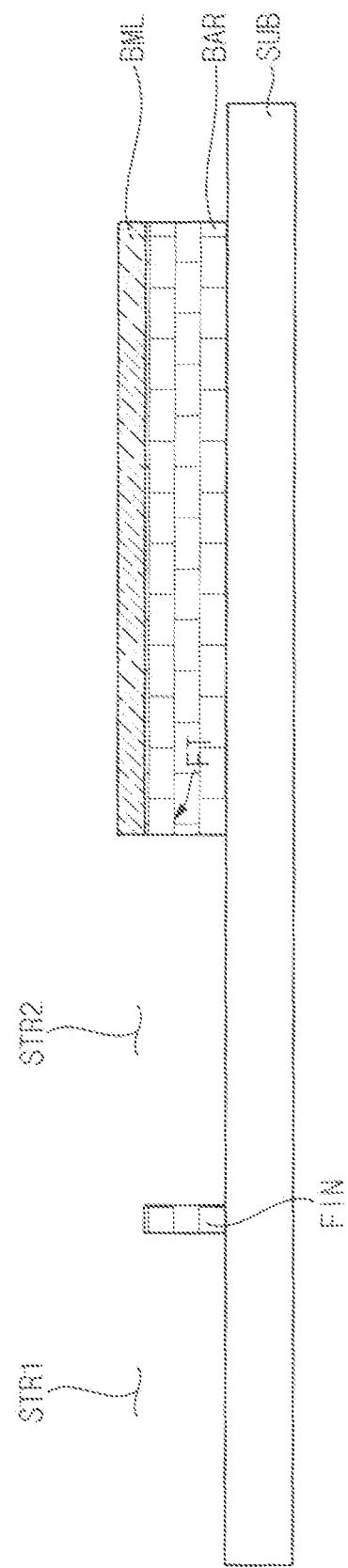

Referring to FIG. 32, the lower conductive layer HBML in the fin area FIN may be removed, and the photoresist layer PR in the third area NTA may be completely removed through an etching process. Accordingly, the lower electrode BML may be formed.

Figure 33:
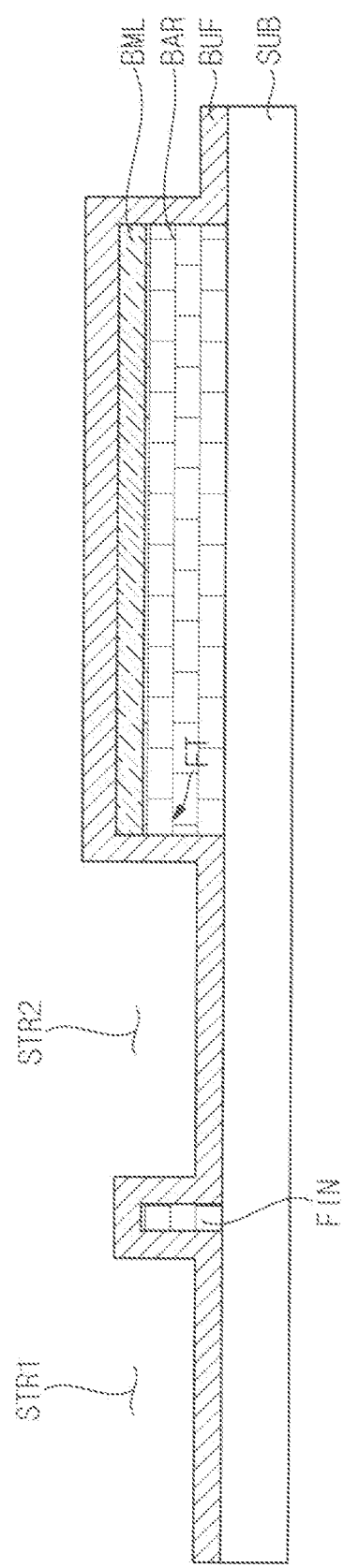

Referring to FIG. 33, the buffer layer BUF may be formed on the barrier layer BAR to cover the lower electrode BML.

Figure 34:
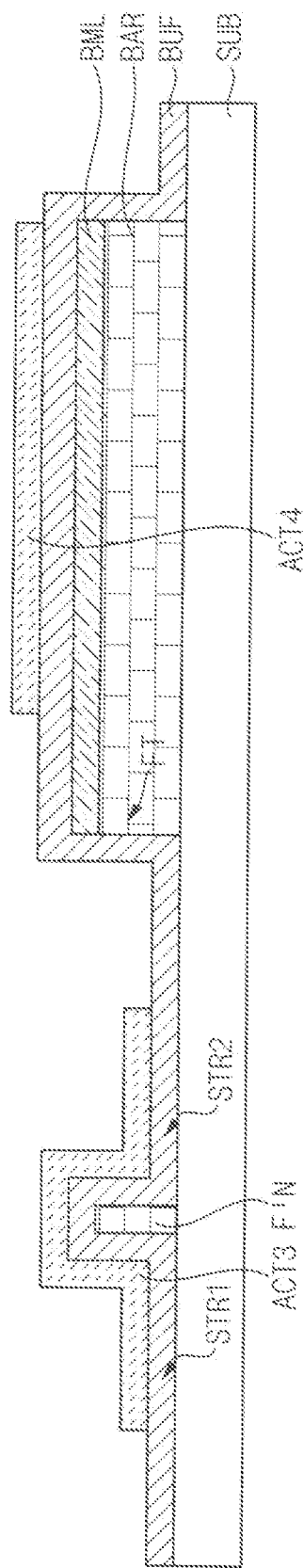

Referring to FIG. 34, the third active layer ACT3 may be formed to cover the fin area FIN. A portion of the third active layer ACT3 may be disposed at (e.g., in or on) the first sub trench area STR1, and another portion of the third active layer ACT3 may be disposed at (e.g., in or on) the second sub trench area STR2. In other words, the third active layer ACT3 may be disposed along a profile of the trench area.

The fourth active layer ACT4 may be disposed on the flat area FT. The fourth active layer ACT4 may have a flat or substantially flat shape.

Figure 35:
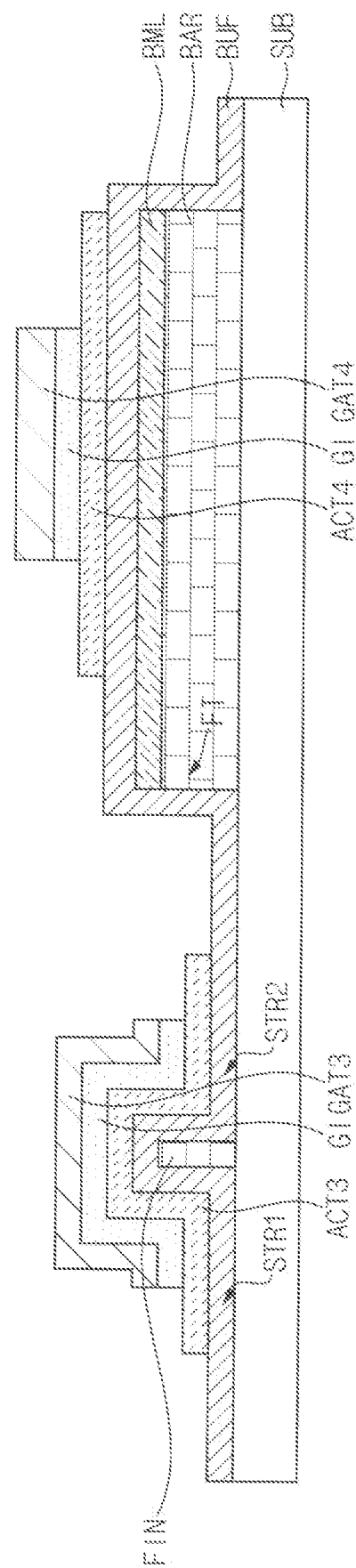
Figure 36:
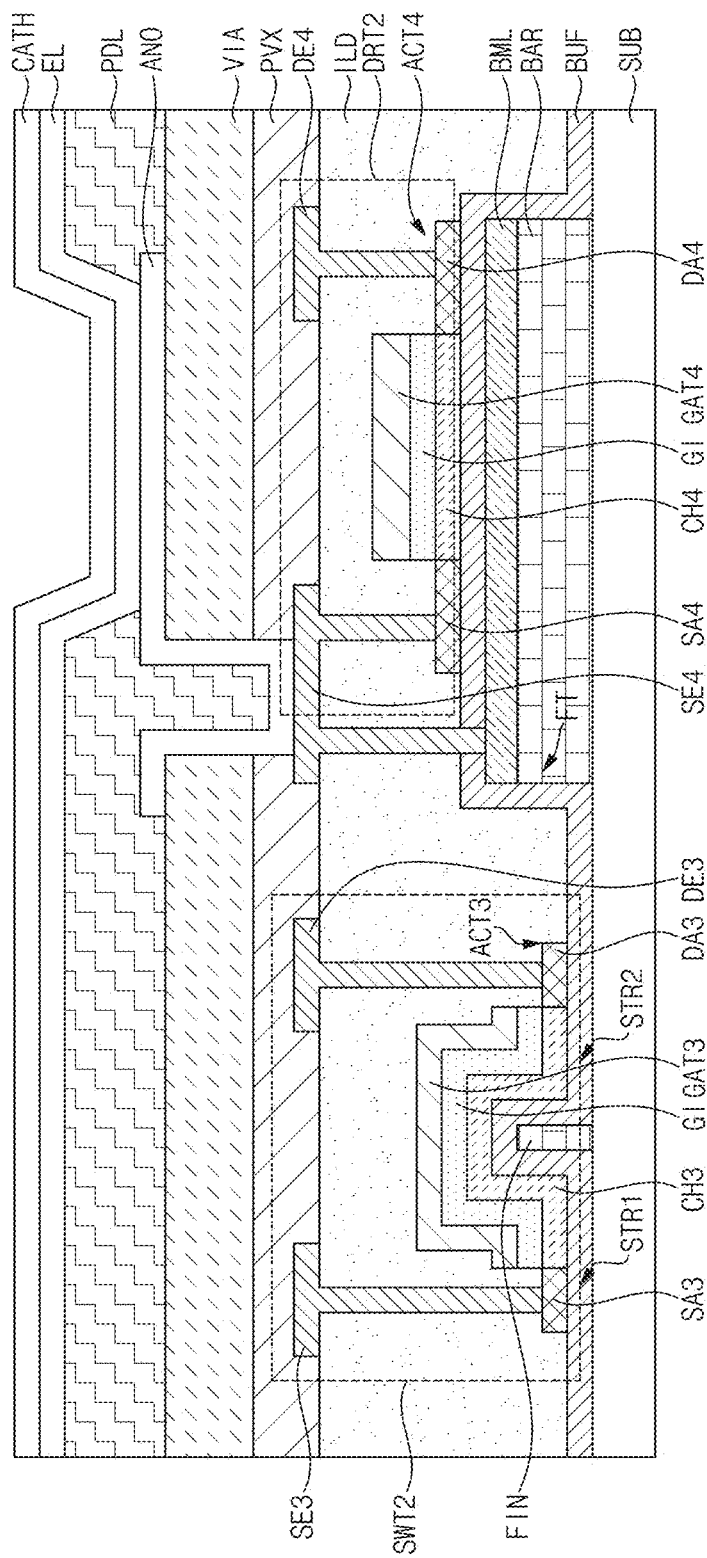

The processes illustrated in FIG. 35 and FIG. 36 may be the same or substantially the same as the processes described above with reference to FIG. 13 and FIG. 14, and thus, redundant description thereof will not be repeated.

Figure 37:
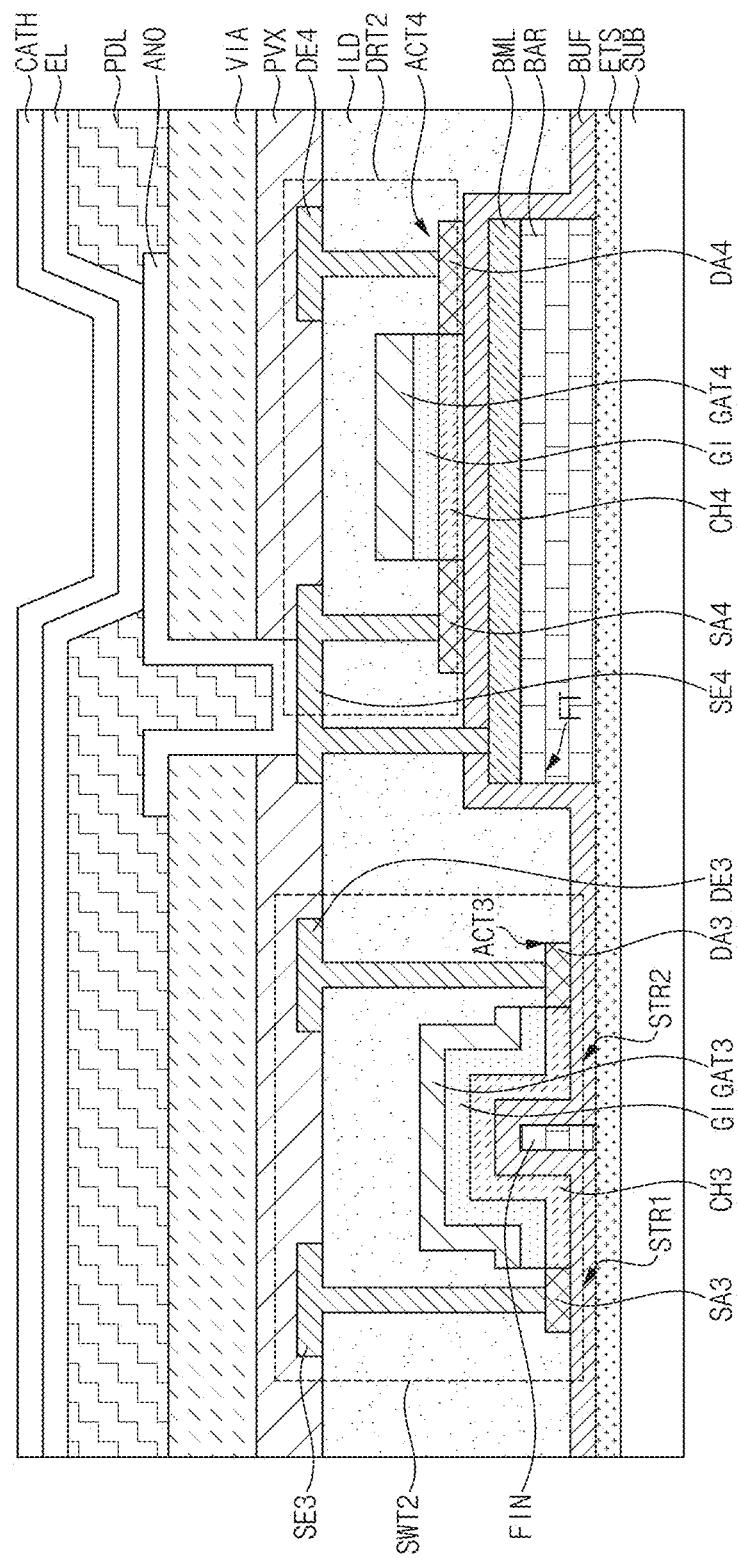
FIG. 37 is a cross-sectional view taken along the line I-I' of FIG. 1 according to another embodiment.

FIG. 37 is a cross-sectional view taken along the line I-I' of FIG. 1 according to another embodiment. FIG. 37 may be the same or substantially the same as FIG. 27, except that an etch stopper ETS is further included. The other elements shown in FIG. 37, except the etch stopper ETS, may be the same or substantially the same as those described above with reference to FIG. 27, and thus, redundant description thereof may not be repeated, and the differences between the embodiments of FIG. 27 and FIG. 37 may be mainly described hereinafter.

Referring to FIG. 37, the etch stopper ETS may be disposed between the substrate SUB and the barrier layer BAR. Thus, when the trench area TR is formed in the barrier layer BAR, the etch stopper ETS may prevent or substantially prevent damage to the substrate SUB due to over-etching. In addition, the etch stopper ETS may serve to assist the trench area TR to have a uniform or substantially uniform depth.

In an embodiment, the etch stopper ETS may include an inorganic insulation material. Examples of the inorganic insulation material may include (e.g., may be) silicon oxide, silicon nitride, silicon oxynitride, and/or the like. These inorganic insulation materials may be used alone or in any suitable combinations with each other. As another example, the etch stopper ETS may include an oxide. Examples of the oxide may include (e.g., may be) indium oxide, gallium oxide, zinc oxide, hafnium oxide, titanium oxide, zirconium oxide, and/or the like. These oxides may be used alone or in any suitable combinations with each other.

FIG. 38 through FIG. 45 are cross-sectional views illustrating various processes of a method of manufacturing the display device of FIG. 1 according to another embodiment.

Figure 38:
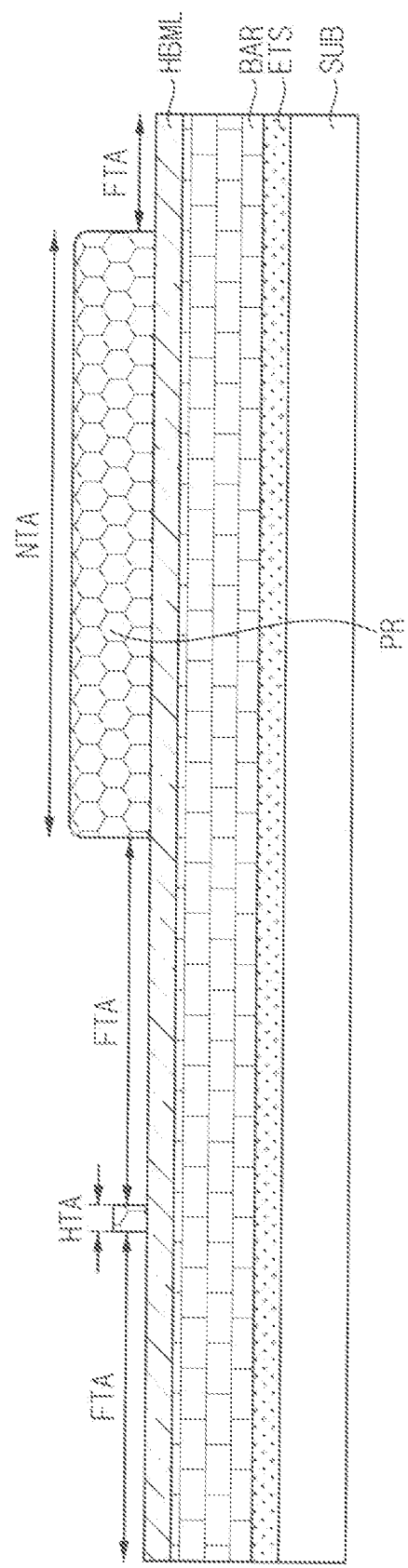
FIGS. 38-45 are cross-sectional views illustrating various processes of a method of manufacturing the display device of FIG. 1 according to another embodiment.
Figure 39:
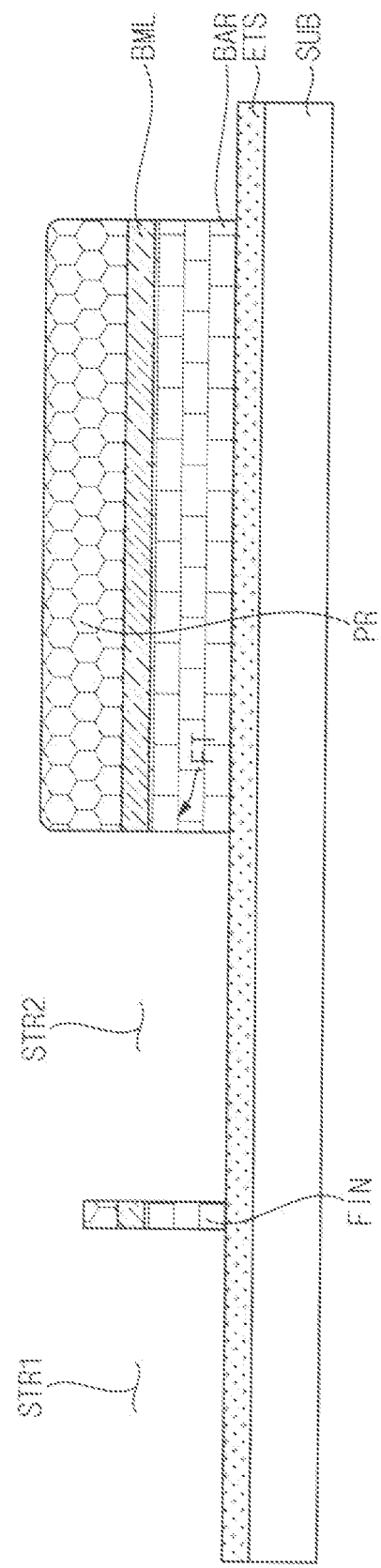
Figure 40:
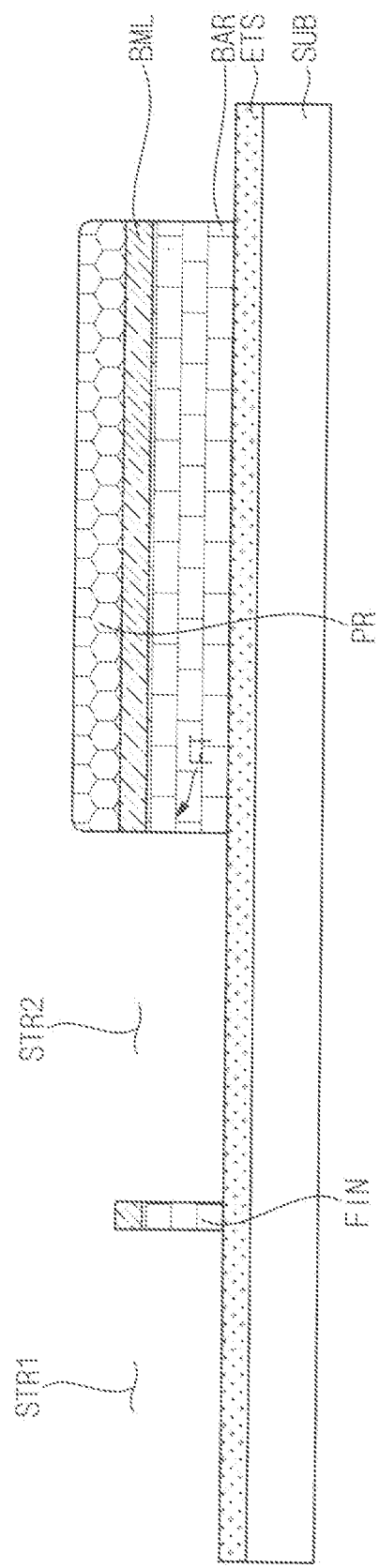
Figure 41:
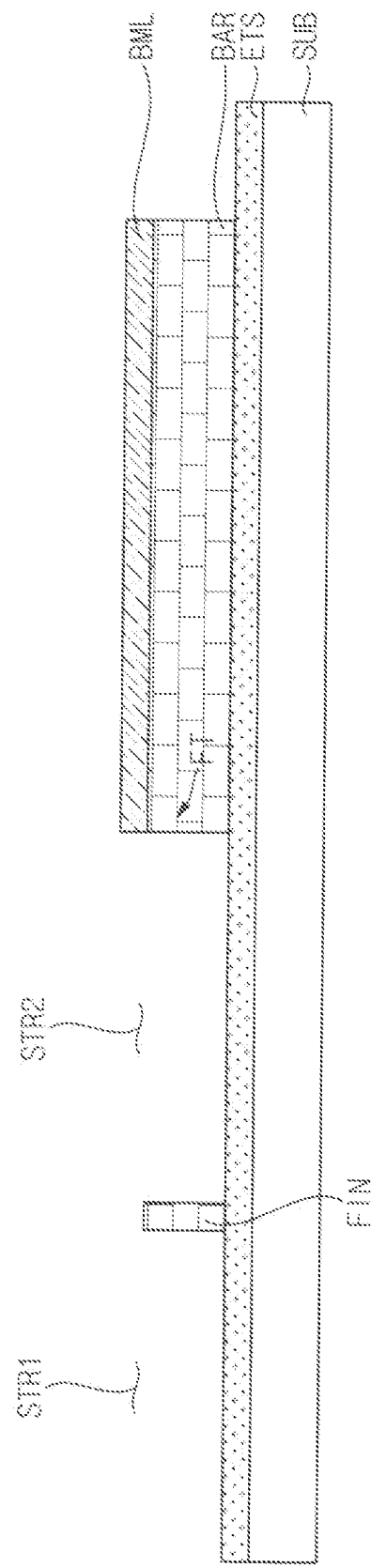
Figure 42:
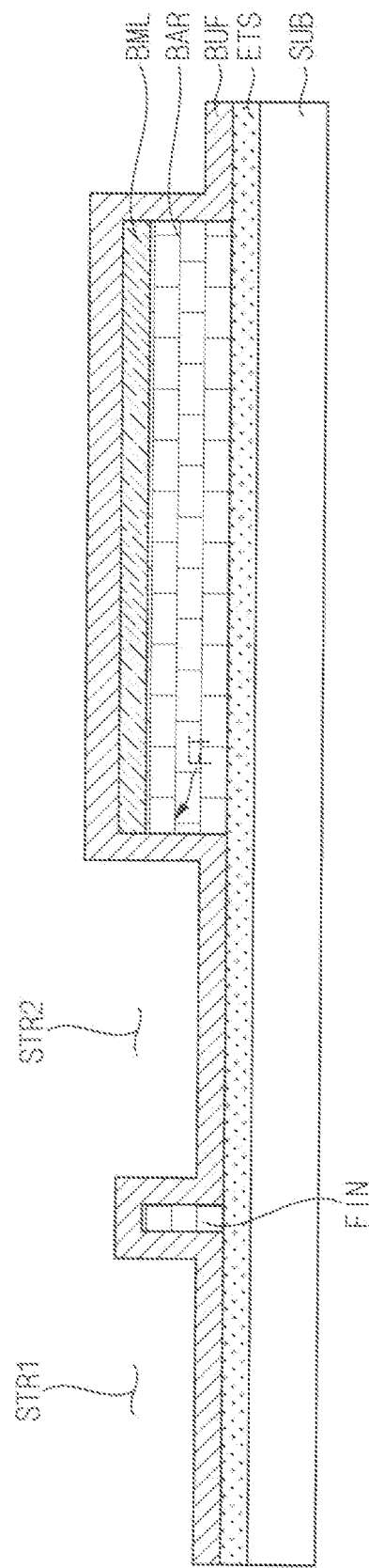
Figure 43:
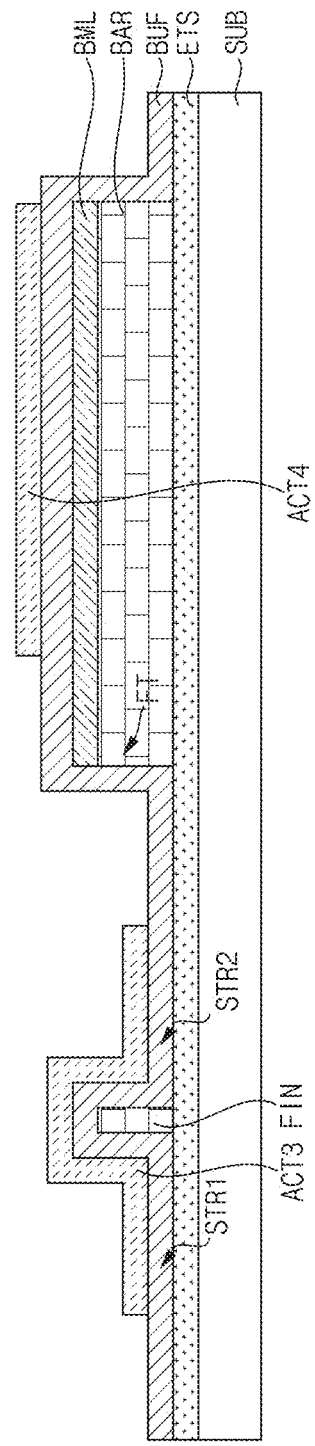
Figure 44:
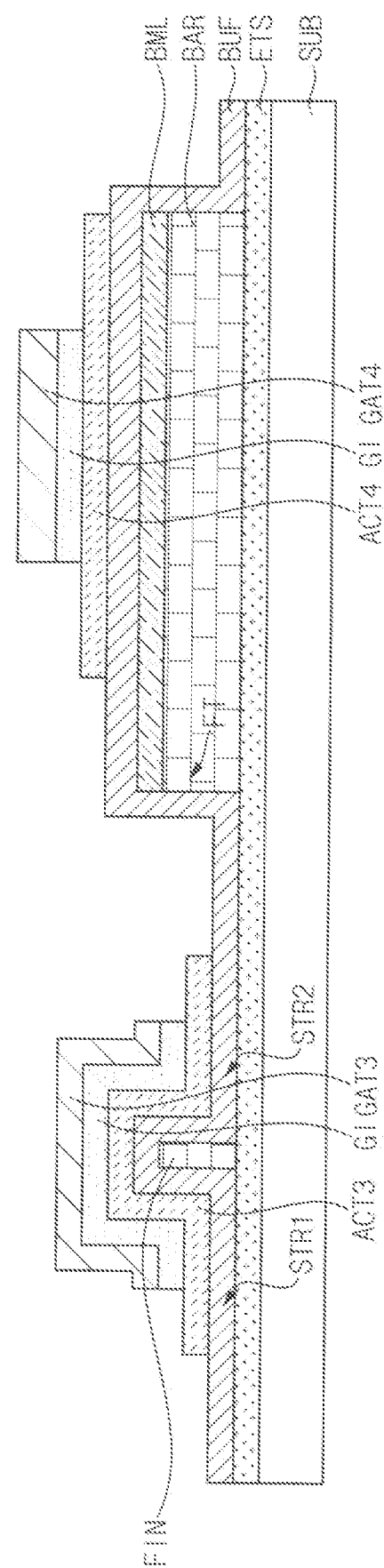
Figure 45:
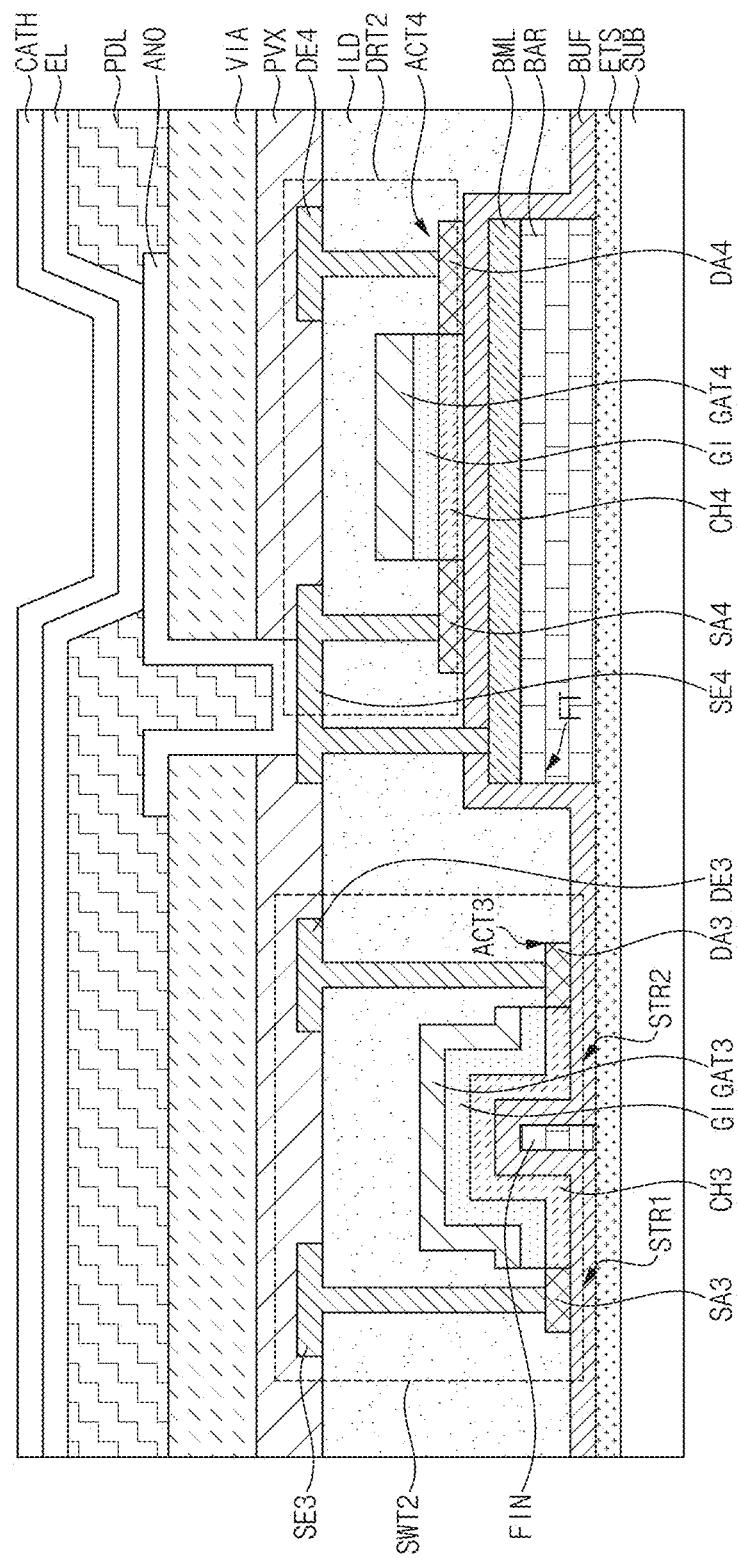

The method shown in FIG. 38 through FIG. 45 may be the same or substantially the same as the method shown in FIG. 29 through FIG. 36, except that the etch stopper ETS is further formed. For example, as shown in FIG. 38, the etch stopper ETS, the barrier layer BAR, and a lower conductive layer HBML may be sequentially formed on the substrate SUB, and a photoresist layer PR may be disposed generally on the lower conductive layer HBML. Thereafter, the method shown in FIG. 38 through FIG. 45 may be the same or substantially the same as the method described above with reference to FIG. 29 through FIG. 36, and thus, redundant description thereof will not be repeated.

Although some embodiments have been described, those skilled in the art will readily appreciate that various modifications are possible in the embodiments without departing from the spirit and scope of the present disclosure. It will be understood that descriptions of features or aspects within each embodiment should typically be considered as available for other similar features or aspects in other embodiments, unless otherwise described. Thus, as would be apparent to one of ordinary skill in the art, features, characteristics, and/or elements described in connection with a particular embodiment may be used singly or in combination with features, characteristics, and/or elements described in connection with other embodiments unless otherwise specifically indicated. Therefore, it is to be understood that the foregoing is illustrative of various example embodiments and is not to be construed as limited to the specific embodiments disclosed herein, and that various modifications to the disclosed embodiments, as well as other example embodiments, are intended to be included within the spirit and scope of the present disclosure as defined in the appended claims, and their equivalents.

What is claimed is:

1. A display device, comprising:
   a substrate;
   a barrier layer on the substrate, and comprising:
      a trench area recessed in a direction towards the substrate; and
      a flat area surrounding the trench area, and having a flat upper surface; and
   a switching transistor and a driving transistor on the barrier layer,
   wherein the switching transistor comprises:
      a first active layer on the barrier layer, at least a portion of the first active layer being located at the trench area, the first active layer comprising a channel area, and a source area and a drain area at opposite sides of the channel area;
      a first gate electrode on the first active layer; and
      a first upper electrode and a second upper electrode on and connected to the first active layer.

2. The display device of claim 1, wherein the channel area is located in the trench area.

3. The display device of claim 1, wherein the trench area comprises a first sub trench area, a second sub trench area, and a fin area between the first sub trench area and the second sub trench area, and
   wherein the first active layer covers the fin area, and fills at least a portion of the first sub trench area and at least a portion of the second sub trench area.

4. The display device of claim 3, wherein the channel area covers the fin area.

5. The display device of claim 1, wherein the driving transistor comprises:
   a second active layer on the flat area of the barrier layer;
   a second gate electrode on the second active layer; and
   a third upper electrode and a fourth upper electrode on and connected to the second active layer.

6. The display device of claim 5, further comprising:
   a lower electrode between the barrier layer and the second active layer, and overlapping with the second active layer, and
   wherein the lower electrode is connected to the second active layer through the third upper electrode.

7. The display device of claim 6, further comprising:
a light emitting element on the third upper electrode, and electrically connected to the third upper electrode.

8. The display device of claim 1, further comprising:
an etch stopper between the substrate and the barrier layer.

9. The display device of claim 8, wherein the etch stopper comprises at least one selected from the group consisting of indium oxide, gallium oxide, zinc oxide, hafnium oxide, titanium oxide, and zirconium oxide.

10. The display device of claim 8, wherein the etch stopper comprises at least one selected from the group consisting of silicon oxide, silicon nitride, and silicon oxynitride.

11. The display device of claim 1, wherein the trench area exposes the substrate.

12. The display device of claim 1, further comprising:
a first insulation layer between the first active layer and the barrier layer;
a second insulation layer on the first active layer to overlap with the channel area;
a third insulation layer covering the first gate electrode, the source area, and the drain area; and
a fourth insulation layer on the third insulation layer to cover the first upper electrode and the second upper electrode,
wherein the first gate electrode overlaps with the second insulation layer.

13. The display device of claim 12, wherein the third insulation layer covers a side surface of the first gate electrode and a side surface of the second insulation layer.

* * * * *